US012010891B2

United States Patent
Son et al.

(10) Patent No.: US 12,010,891 B2
(45) Date of Patent: Jun. 11, 2024

(54) DISPLAY DEVICE

(71) Applicant: Samsung Display Co., LTD., Yongin-si (KR)

(72) Inventors: Jong Ho Son, Seoul (KR); Young Gu Kim, Yongin-si (KR); Ji Yun Park, Hwaseong-si (KR); Bong Sung Seo, Suwon-si (KR); Yeon Hee Lee, Asan-si (KR); Baek Kyun Jeon, Yongin-si (KR); Kyung Seon Tak, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 115 days.

(21) Appl. No.: 17/494,352

(22) Filed: Oct. 5, 2021

(65) Prior Publication Data

US 2022/0262870 A1 Aug. 18, 2022

(30) Foreign Application Priority Data

Feb. 15, 2021 (KR) .................. 10-2021-0020038

(51) Int. Cl.
*H10K 59/35* (2023.01)

(52) U.S. Cl.
CPC ......... *H10K 59/353* (2023.02); *H10K 59/351* (2023.02); *H10K 59/352* (2023.02)

(58) Field of Classification Search
CPC ....... H10K 59/351–353; H10K 59/121; H10K 59/35; G09G 2300/0452
See application file for complete search history.

(56) References Cited

U.S. PATENT DOCUMENTS

| 2002/0015110 | A1* | 2/2002 | Brown Elliott ...... G09G 3/3614 345/589 |
| 2013/0241946 | A1 | 9/2013 | Jeong et al. |
| 2015/0249115 | A1* | 9/2015 | Chen ...................... H10K 71/00 438/34 |
| 2017/0039911 | A1 | 2/2017 | Guo et al. |
| 2018/0175104 | A1* | 6/2018 | Kang ........................ F21K 9/68 |
| 2019/0355793 | A1* | 11/2019 | Oh ........................ H10K 59/122 |
| 2020/0075691 | A1* | 3/2020 | Zhou ...................... H10K 59/35 |
| 2020/0328259 | A1* | 10/2020 | Joe ........................ H10K 71/166 |
| 2021/0399061 | A1* | 12/2021 | Ji .......................... H10K 59/352 |

FOREIGN PATENT DOCUMENTS

| KR | 10-0887639 | 3/2009 |
| KR | 10-1485166 | 1/2015 |

* cited by examiner

*Primary Examiner* — Eric K Ashbahian
(74) *Attorney, Agent, or Firm* — KILE PARK REED & HOUTTEMAN PLLC

(57) ABSTRACT

A display device comprises pixels including a first sub-pixel, a second sub-pixel, a third sub-pixel, a fourth sub-pixel, and a fifth sub-pixel, each sub-pixel including an emission area, wherein the first sub-pixel and the fourth sub-pixel emit light of a first color, the second sub-pixel and the fifth sub-pixel emit light of a second color, the third sub-pixel emits light of a third color, a first emission area of the first sub-pixel, a second emission area of the second sub-pixel, a fourth emission area of the fourth sub-pixel, and a fifth emission area of the fifth sub-pixel surround a third emission area of the third sub-pixel, and the third emission area of the third sub-pixel has four interior angles equal to or greater than about 180 degrees, and another four interior angles equal to or less than about 90 degrees.

20 Claims, 14 Drawing Sheets

SP: SP1, SP2, SP3, SP4, SP5

DISPLAY DEVICE

CROSS-REFERENCE TO RELATED APPLICATION(S)

This application claims priority to and the benefit of Korean Patent Application No. 10-2021-0020038 under 35 U.S.C. § 119, filed on Feb. 15, 2021, in the Korean Intellectual Property Office (KIPO), the entire contents of which are incorporated herein by reference.

BACKGROUND

1. Technical Field

The disclosure relates to a display device.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

SUMMARY

Aspects of the disclosure provide a display device capable of facilitating an inkjet process and increasing an opening ratio.

However, aspects of the disclosure are not restricted to the one set forth herein. The above and other aspects of the disclosure will become more apparent to one of ordinary skill in the art to which the disclosure pertains by referencing the detailed description of the disclosure given below.

In the display device according to embodiments, a practical resolution may be increased by providing two sub-pixels emitting light of a first color and two sub-pixels emitting light of a second color in one pixel. Further, luminance and lifespan may be improved by increasing the areas of the sub-pixels emitting light of the first color and light of the second color to be larger than that of a sub-pixel emitting light of a third color.

Furthermore, the sub-pixels emitting light of the first color and the light of the second color may be formed to have a quadrangular or triangular shape with a short circumference in a plan view, and the sub-pixels emitting light of the third color may be formed to have an approximately cross shape in a plan view, thereby increasing an opening ratio and improving the margin of ink overflow in the inkjet process of a wavelength conversion layer.

It should be noted that the effects of the disclosure are not limited to those described above, and other effects of the disclosure will be apparent from the following description.

According to an embodiment of the disclosure, a display device may comprise pixels including a first sub-pixel including a first emission area, a second sub-pixel including a second emission area, a third sub-pixel including a third emission area, a fourth sub-pixel including a fourth emission area, and a fifth sub-pixel including a fifth emission area. The first sub-pixel and the fourth sub-pixel may emit light of a first color, the second sub-pixel and the fifth sub-pixel may emit light of a second color, the third sub-pixel may emit light of a third color, the first emission area of the first sub-pixel, the second emission area of the second sub-pixel, the fourth emission area of the fourth sub-pixel, and the fifth emission area of the fifth sub-pixel may surround the third emission area of the third sub-pixel, and the third emission area of the third sub-pixel may have four interior angles equal to or greater than about 180 degrees and another four interior angles equal to or less than about 90 degrees.

In an embodiment, the first color may be red, the second color may be green, and the third color may be blue.

In an embodiment, the first emission area and the third emission area may be disposed adjacent to each other with the third emission area disposed between the first emission area and the third emission area, and the second emission area and the fourth emission area may be adjacent to each other with the third emission area disposed between the second emission area and the fourth emission area.

In an embodiment, each of the first emission area, the second emission area, the fourth emission area, and the fifth emission area may have a rectangular shape having three interior angles equal to or less than about 90 degrees and one interior angle greater than about 90 degrees.

In an embodiment, in each of the first emission area, the second emission area, the fourth emission area, and the fifth emission area, a vertex of the one interior angle greater than about 90 degrees may be disposed closer to a central point of the third emission area than each of vertices of the three interior angles equal to or less than about 90 degrees.

In an embodiment, in each of the first emission area, the second emission area, the fourth emission area, and the fifth emission area, a vertex of the one interior angle greater than about 90 degrees may meet an imaginary line passing through a central point of the emission area corresponding to the vertex and a central point of the third emission area.

In an embodiment, vertices of the four interior angles equal to or greater than about 180 degrees, which are included in the third emission area, may meet the imaginary line.

In an embodiment, the four interior angles equal to or greater than about 180 degrees and the another four interior angles equal to or less than about 90 degrees, which are included in the third emission area, may be alternately arranged in a clockwise direction.

In an embodiment, vertices of the four interior angles equal to or greater than about 180 degrees, which are included in the third emission area, may be disposed closer to a central point of the third emission area than vertices of the another four interior angles equal to or less than about 90 degrees, which are included in the third emission area.

In an embodiment, a sum of an area of the first emission area and an area of the fourth emission area may be larger than an area of the third emission area, and a sum of areas of the second emission area and the fifth emission area is larger than the area of the third emission area.

In an embodiment, a ratio of the sum of the areas of the first emission area and the fourth emission area to the area of the third emission area may be in a range of about 2 to about 2.7.

In an embodiment, a ratio of the sum of the areas of the second emission area and the fifth emission area to the area of the third emission area may be in a range of about 2.4 to about 3.13.

According to an embodiment of the disclosure, a display device may comprise pixels including a first sub-pixel including a first emission area, a second sub-pixel including a second emission area, a third sub-pixel including a third emission area, a fourth sub-pixel including a fourth emission area, and a fifth sub-pixel including a fifth emission area. The first sub-pixel and the fourth sub-pixel may emit light of a first color, the second sub-pixel and the fifth sub-pixel may emit light of a second color, the third sub-pixel may emit light of a third color, the first emission area of the first sub-pixel, the second emission area of the second sub-pixel, the fourth emission area of the fourth sub-pixel, and the fifth emission area of the fifth sub-pixel may have a triangular shape and may surround the third emission area of the third sub-pixel, and the third emission area of the third sub-pixel may include four interior angles equal to or greater than about 180 degrees and another four interior angles equal to or less than about 90 degrees.

In an embodiment, each of the first emission area, the second emission area, the fourth emission area, and the fifth emission area may have a triangular shape having one interior angle equal to or greater than about 90 degrees and two interior angles less than about 90 degrees.

In an embodiment, in each of the first emission area, the second emission area, the fourth emission area, and the fifth emission area, a vertex of the one interior angle equal to or greater than about 90 degrees may be disposed closer to a central point of the third emission area than each of vertices of the two interior angles less than about 90 degrees.

In an embodiment, a ratio of a sum of an area of the first emission area and an area of the fourth emission area to an area of the third emission area may be in a range of about 2 to about 2.7.

In an embodiment, a ratio of a sum of an area of the second emission area and an area of the fifth emission area to an area of the third emission area may be in a range of about 2.4 to about 3.13.

In an embodiment, each of the first sub-pixel, the second sub-pixel, the third sub-pixel, the fourth sub-pixel, and the fifth sub-pixel may include a light emitting element layer, and the light emitting element layer may include a first electrode and a second electrode extending in a direction and arranged parallel to each other and disposed on a substrate, a light emitting element having a first end and a second end disposed on the first electrode and the second electrode, respectively, and a first connection electrode electrically connected to the first end of the light emitting element and a second connection electrode connected to the second end of the light emitting element.

In an embodiment, the light emitting element includes a first semiconductor layer, a second semiconductor layer disposed on the first semiconductor layer, a light emitting layer disposed between the first semiconductor layer and the second semiconductor layer, and an insulating layer overlapping the first semiconductor layer, the second semiconductor layer, and the light emitting layer.

In an embodiment, each of the first sub-pixel, the second sub-pixel, the third sub-pixel, the fourth sub-pixel, and the fifth sub-pixel may include a wavelength conversion layer disposed on the light emitting element layer, and the wavelength conversion layer may include a first wavelength conversion member disposed in the first sub-pixel and the fourth sub-pixel and converting light of the third color into light of the first color, a second wavelength conversion member disposed in the second sub-pixel and the fifth sub-pixel and converting light of the third color into light of the second color, and a light transmission member disposed in the third sub-pixel and transmitting light of the third color.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
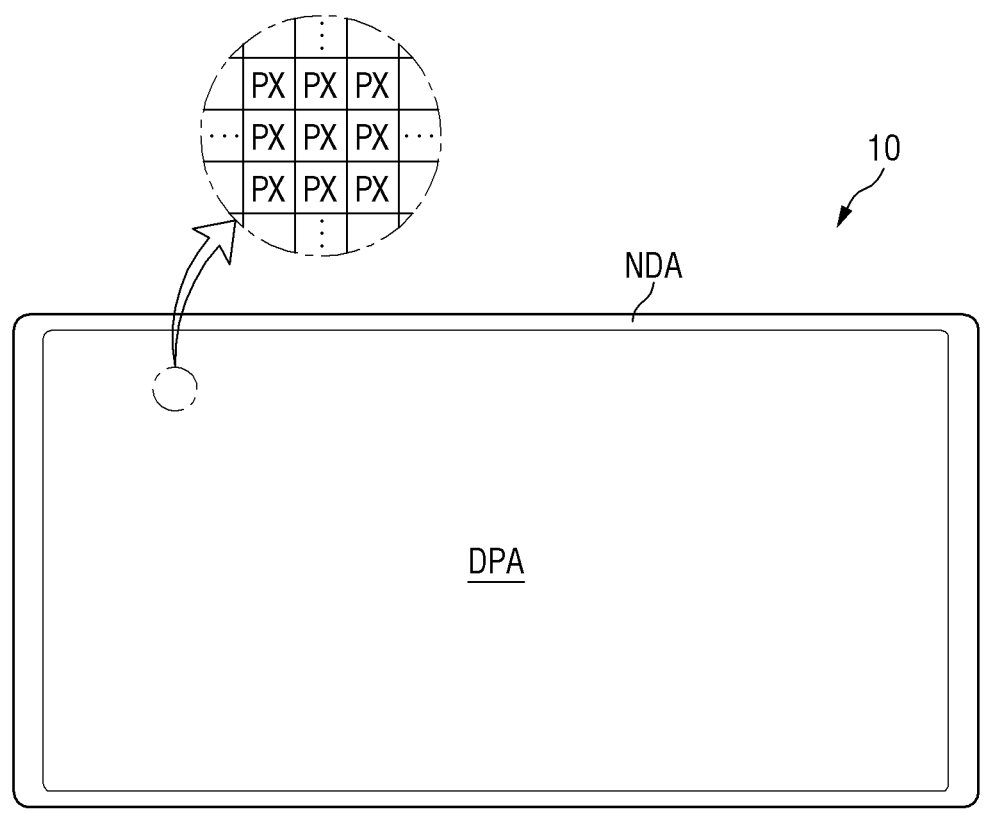
FIG. 1 is a schematic plan view of a display device according to an embodiment.
Figure 1:
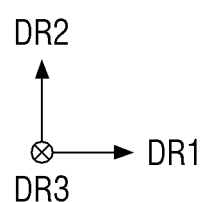

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Each of the features of the various embodiments of the disclosure may be combined or combined with each other, in part or in whole, and technically various interlocking and driving are possible. Each embodiment may be implemented independently of each other or may be implemented together in an association.

Hereinafter, embodiments will be described in detail with reference to the accompanying drawings.

Figure 2:
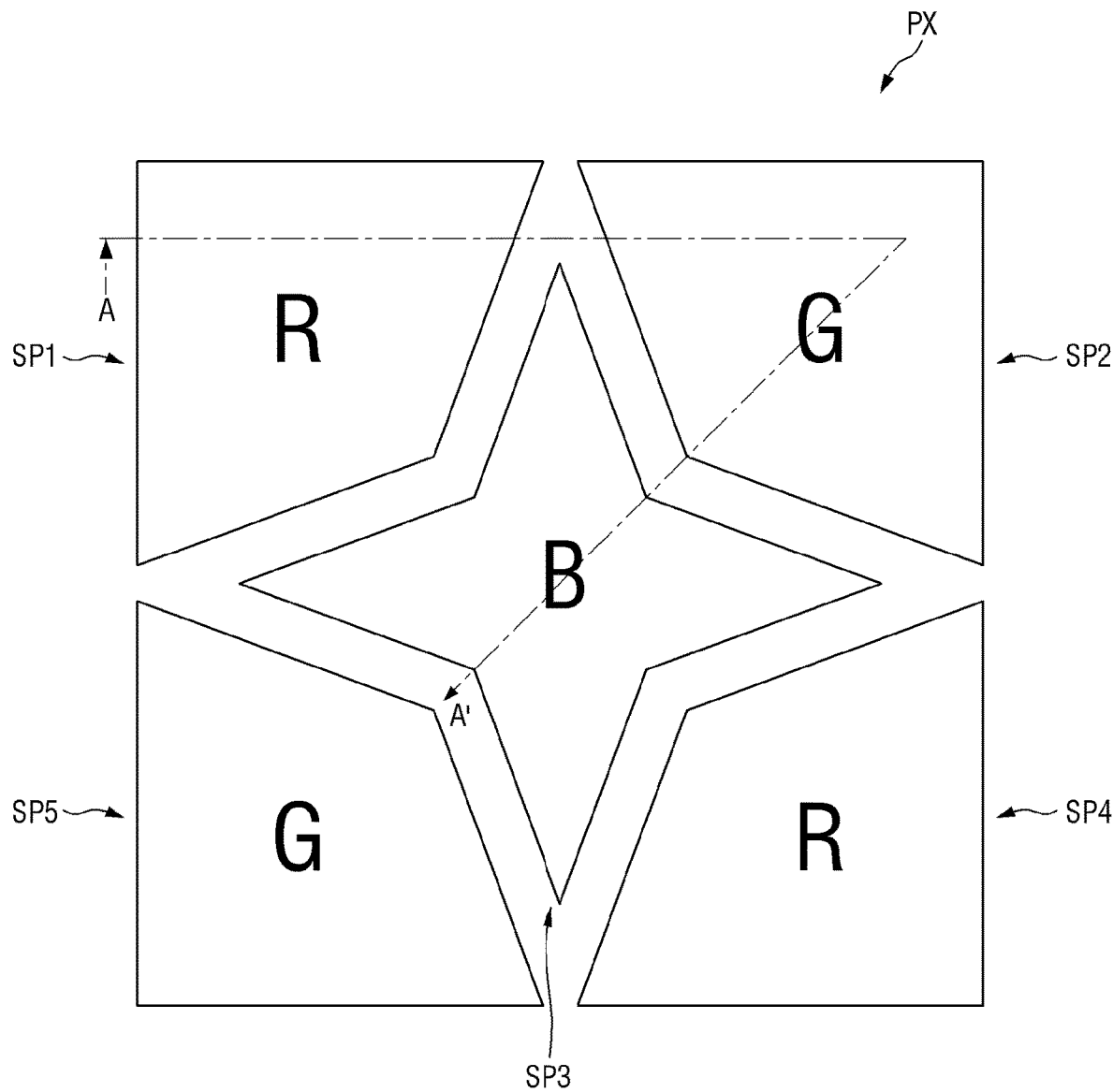
FIG. 2 is schematic a plan view illustrating a pixel according to an embodiment.

FIG. 1 is a schematic plan view of a display device according to an embodiment. FIG. 2 is a schematic plan view illustrating a pixel according to an embodiment.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smartwatch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 includes a display panel which provides a display screen. Examples of the display panel may include an inorganic light emitting diode display panel, an organic light emitting display panel, a quantum dot light emitting display panel, a plasma display panel, and a field emission display panel. In the following description, a case where an inorganic light emitting diode display panel is applied as an example of a display panel, but the disclosure is not limited thereto, and other display panels may be applied within the same scope of technical spirit.

A first direction DR1, a second direction DR2, a third direction DR3 are defined in the drawing illustrating the display device 10. The first direction DR1 and the second direction DR2 may be perpendicular to each other in a plane. The third direction DR3 may be a direction perpendicular to a plane defined by the first direction DR1 and the second direction DR2. The third direction DR3 is perpendicular to each of the first direction DR1 and the second direction DR2. In the embodiment describing the display device 10, the third direction DR3 indicates a thickness direction of the display device 10.

The shape of the display device 10 may be variously modified. For example, the display device 10 may have a rectangular shape including long and short sides such that the side in the first direction DR1 is longer than the side in the second direction DR2 in a plan view. For another example, the display device 10 may have a rectangular shape including long and short sides such that the side in the second direction DR2 is longer than the side in the first direction DR1 in a plan view. However, the disclosure is not limited thereto, and the planar shape of the display device 10 may be a square shape, a quadrilateral shape with rounded corners (vertices), other polygonal shapes and a circular shape, or the like. The shape of a display area DPA of the display device 10 may be similar to the overall shape of the display device 10. FIG. 1 illustrates the display device 10 and the display area DPA having a rectangular shape in which the sides in the first direction DR1 are longer than the sides in the second direction DR2.

The display device 10 may include the display area DPA and a non-display area NDA. The display area DPA is an area where an image can be displayed, and the non-display area NDA is an area where an image is not displayed. The display area DPA may also be referred to as an active region, and the non-display area NDA may also be referred to as a non-active region. The display area DPA may substantially occupy the center of the display device 10.

The display area DPA may include pixels PX. The pixels PX may be arranged in a matrix. The shape of each pixel PX may be a rectangular or square shape in a plan view. However, the disclosure is not limited thereto, and it may be a rhombic shape in which each side is inclined with respect to a direction. The pixels PX may be alternately disposed in a stripe type or a PENTILE™ type. Each of the pixels PX may include one or more light emitting elements 30 that emit light of a specific wavelength band to display a specific color.

Referring to FIG. 2, each of the pixels PX may include sub-pixels SP1, SP2, SP3, SP4, and SP5. For example, a pixel PX may include a first sub-pixel SP1, a second sub-pixel SP2, a third sub-pixel SP3, a fourth sub-pixel SP4, and a fifth sub-pixel SP5. The first sub-pixel SP1 may emit light of a first color, the second sub-pixel SP2 may emit light of a second color, and the third sub-pixel SP3 may emit light of a third color. For example, the first color may be red, the second color may be green, and the third color may be blue. The fourth sub-pixel SP4 may emit light of the first color, and the fifth sub-pixel SP5 may emit light of the second color. Although FIG. 2 illustrates that the pixel PX includes five sub-pixels SP, the disclosure is not limited thereto, and the pixel PX may include a larger number of sub-pixels SP. The structure of the pixel PX will be described in detail below.

Referring back to FIG. 1, the non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 3:
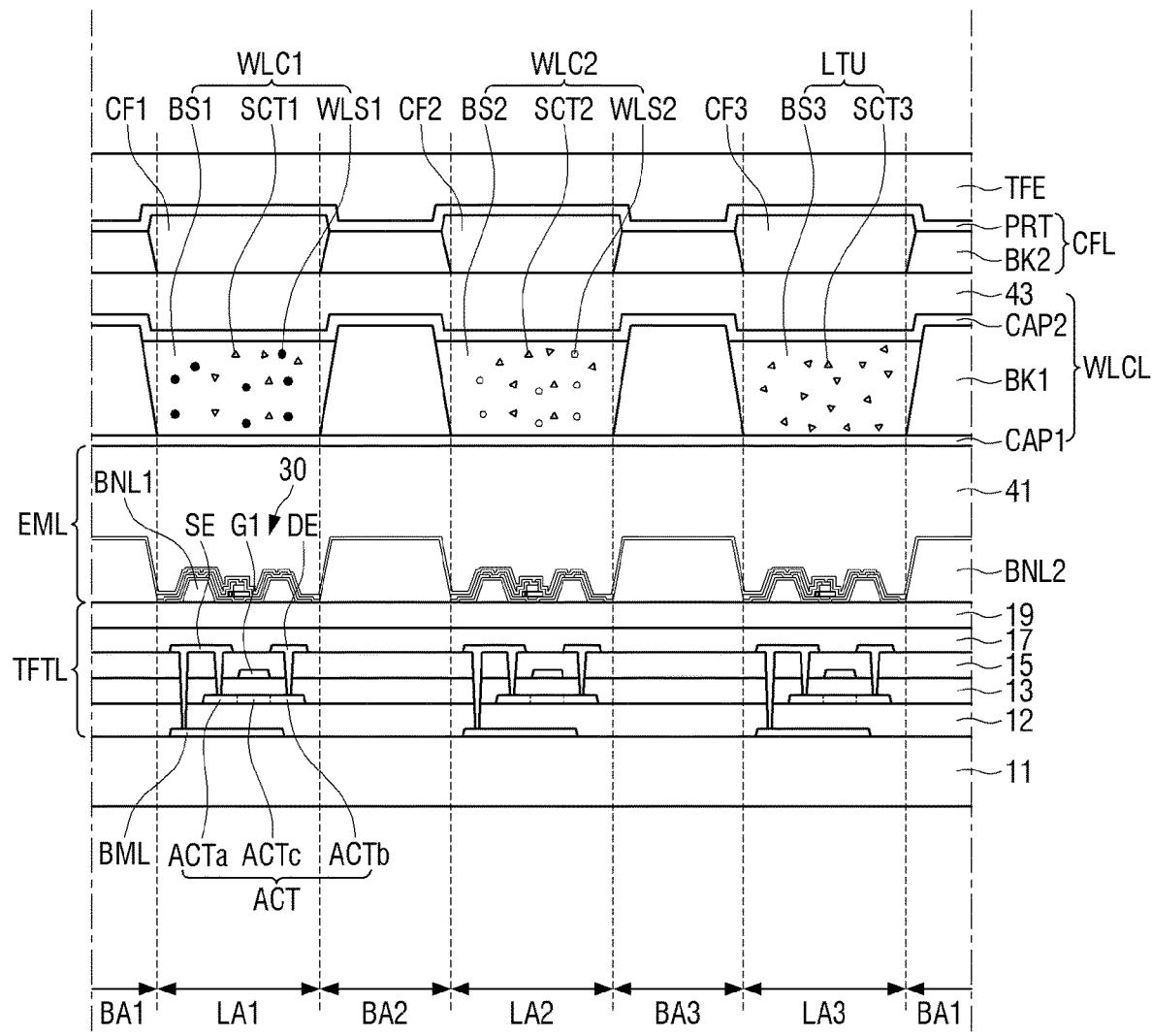
FIG. 3 is a schematic cross-sectional view taken along line A-A' of FIG. 2.
Figure 3:
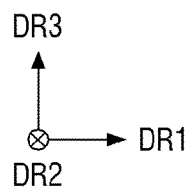

FIG. 3 is a schematic cross-sectional view taken along line A-A' of FIG. 2. FIG. 3 illustrates the first sub-pixel SP1, the second sub-pixel SP2, and the third sub-pixel SP3 as an example, and the fourth sub-pixel SP4 and the fifth sub-pixel SP5 are omitted since they have the same structure as the first sub-pixel SP1 and the second sub-pixel SP2, respectively.

Referring to FIG. 3, the display area DPA of the display device 10 may include first to third emission areas LA1, LA2, and LA3. Each of the first to third emission areas LA1, LA2, and LA3 may be an area in which light generated from the light emitting element 30 of the display device 10 is emitted to the outside of the display device 10. The first emission area LA1 may be included in the first sub-pixel SP1, the second emission area LA2 may be included in the second sub-pixel SP2, and the third emission area LA3 may be included in the third sub-pixel SP3.

The display device 10 may include a substrate 11, a buffer layer 12, a transistor layer TFTL, a light emitting element layer EML, a wavelength conversion layer WLCL, a color filter layer CFL, and an encapsulation layer TFE.

The substrate 11 may be a base substrate or a base member and may be made of an insulating material such as a polymer resin. For example, the substrate 11 may be a flexible substrate which can be bent, folded, or rolled. The substrate 11 may include polyimide (PI), but the disclosure is not limited thereto.

The buffer layer 12 may be disposed on the substrate 11. The buffer layer 12 may be formed of an inorganic layer that is capable of preventing air or moisture infiltration. For example, the buffer layer 12 may include inorganic layers laminated or stacked alternately.

The transistor layer TFTL may be disposed on the buffer layer 12. The transistor layer TFTL may include a first transistor T1, a gate insulating layer 13, a first interlayer insulating layer 15, a second interlayer insulating layer 17, and a first planarization layer 19.

The first transistor T1 may be disposed on the buffer layer 12 and may form a pixel circuit of each of the pixels. For example, the first transistor T1 may be a switching transistor or a driving transistor of the pixel circuit. The first transistor T1 may include an active layer ACT, a gate electrode G1, a source electrode SE, and a drain electrode DE. The active layer ACT may include conductive regions ACTa and ACTb and a channel region ACTc therebetween.

The light emitting element layer EML may be disposed on the transistor layer TFTL. The light emitting element layer EML may include a first pattern BNL1, a light emitting element 30, and a second pattern BNL2. The light emitting element 30 may be disposed above the first transistor T1. The light emitting element 30 may be disposed between a first electrode and a second electrode and may be electrically connected to first and second connection electrodes, respectively.

A detailed description of the aforementioned transistor layer TFTL and light emitting element layer EML will be made below with reference to FIGS. 4 and 5. In the embodiment, a light emitting element in which the light emitting element layer EML includes semiconductor layers is described as an example, but an organic light emitting element including an organic light emitting layer may also be applied.

A second planarization layer 41 may be disposed on the light emitting element layer EML to planarize the top of the light emitting element layer EML. The second planarization layer 41 may include an organic material. For example, the second planarization layer 41 may include at least one of acryl resin, epoxy resin, phenolic resin, polyamide resin, or polyimide resin.

The wavelength conversion layer WLCL may include a first capping layer CAP1, a first light blocking member BK1, a first wavelength conversion member WLC1, a second wavelength conversion member WLC2, a light transmission member LTU, a second capping layer CAP2, and a third planarization layer 43.

The first capping layer CAP1 may be disposed on the second planarization layer 41 of the light emitting element layer EML. The first capping layer CAP1 may seal the bottom surfaces of the light transmission member LTU and the first and second wavelength conversion members WLC1 and WLC2. The first capping layer CAP1 may contain an inorganic material. For example, the first capping layer CAP1 may contain at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

The first light blocking member BK1 may be disposed in the first to third light blocking areas BA1, BA2, and BA3 on the first capping layer CAP1. The first light blocking member BK1 may overlap the second pattern BNL2 in the thickness direction. The first light blocking member BK1 may block transmission of light. The first light blocking member BK1 may prevent light infiltration and color mixture between the first to third emission areas LA1, LA2, and LA3, which leads to the improvement of color reproducibility. The first light blocking member BK1 may be arranged in the form of a grid surrounding the first to third emission areas LA1, LA2, and LA3 in a plan view.

The first light blocking member BK1 may include an organic light blocking material and a lyophobic component. Here, the lyophobic component may be formed of fluorine-containing monomer or fluorine-containing polymer and, in detail, may include fluorine-containing aliphatic polycarbonate. For example, the first light blocking member BK1 may be made of a black organic material including the lyophobic component. The first light blocking member BK1 may be formed by a coating and exposure process of an organic light blocking material including the lyophobic component.

By including the lyophobic component, the first light blocking member BK1 may separate the first and second wavelength conversion members WLC1 and WLC2 and the light transmission member LTU into the corresponding emission areas LA. For example, in the case of forming the first and second wavelength conversion members WLC1 and WLC2 and the light transmission member LTU in an inkjet manner, ink compositions may slide on the top surface of the first light blocking member BK1. In this case, the first light blocking member BK1 containing the lyophobic component may allow the ink composition to slide down to each emission area. Therefore, the first light blocking member BK1 may prevent the ink compositions from being mixed.

The first wavelength conversion member WLC1 may be disposed in the first emission area LA1 on the first capping layer CAP1. The first wavelength conversion member WLC1 may be surrounded by the first light blocking member BK1. The first wavelength conversion member WLC1 may include a first based resin BS1, a first scatterer SCT1, and a first wavelength shifter WLS1.

The first base resin BS1 may contain a material having a relatively high light transmittance. The first base resin BS1 may be formed of a transparent organic material. For example, the first base resin BS1 may contain at least one of organic materials such as epoxy resin, acrylic resin, cardo resin, or imide resin (or epoxy-based resin, acrylic-based resin, cardo-based resin, or imide-based resin).

The first scatterer SCT1 may have a refractive index different from that of the first base resin BS1 and form an optical interface with the first base resin BS1. For example, the first scatterer SCT1 may contain a light scattering material or light scattering particles that scatter at least a portion of transmitted light. For example, the first scatterer SCT1 may contain metal oxide particles such as titanium oxide ($TiO_2$), zirconium oxide ($ZrO_2$), aluminum oxide ($Al_xO_y$), indium oxide ($In_2O_3$), zinc oxide (ZnO), or tin oxide ($SnO_2$), or may contain organic particles such as acrylic resin and urethane resin. The first scatterer SCT1 may scatter light in random directions regardless of the incidence direction of the incident light without any substantial change of the peak wavelength of the incident light.

The first wavelength shifter WLS1 may change or shift the peak wavelength of the incident light to a first peak wavelength. For example, the first wavelength shifter WLS1 may convert blue light, provided from the display device 10, into red light having a single peak wavelength in a range of about 610 nm to about 650 nm and emit the red light. The first wavelength shifter WLS1 may be a quantum dot, a quantum rod, or a fluorescent substance. The quantum dot may be a particulate material that emits light of a specific color in case that an electron transitions from a conduction band to a valence band.

For example, the quantum dot may be a semiconductor nanocrystal material. The quantum dot may have a specific band gap according to its composition and size. Thus, the quantum dot may absorb light and then emit light having an intrinsic wavelength. Examples of the semiconductor nanocrystal of the quantum dot may include group IV nanocrystal, group II-VI compound nanocrystal, group III-V compound nanocrystal, group IV-VI compound nanocrystal, and a combination thereof.

For example, the quantum dot may have a core-shell structure including a core containing the aforementioned nanocrystal and a shell surrounding the core. The shell of the quantum dot may act as a protective layer for maintaining semiconductor characteristics by preventing chemical denaturation of the core and as a charging layer for giving electrophoretic characteristics to the quantum dot. The shell may be formed of a single layer or multiple layers. An interface between the core and the shell may have a concentration gradient in which the concentration of elements present in the shell decreases toward the center. The shell of the quantum dot may be formed of a metallic or nonmetallic oxide, a semiconductor compound, or a combination thereof.

The light emitted from the first wavelength shifter WLS1 may have a full width of half maximum (FWHM) of the emission wavelength spectrum, which is about 45 nm or less, about 40 nm or less, or about 30 nm or less. Thus, the purity and reproducibility of colors displayed by the display device 10 may be further improved. The light emitted from the first wavelength shifter WLS1 may be emitted in various directions regardless of the incidence direction of the incident light. This makes possible to improve lateral visibility of the red color displayed in the first emission area LA1.

A portion of the blue light emitted from the light emitting element layer EML may pass through the first wavelength conversion member WLC1 without being converted to red light by the first wavelength shifter WLS1. Among the blue light emitted from the light emitting element layer EML, the light incident on a first color filter CF1 without being converted by the first wavelength conversion member WLC1 may be blocked by the first color filter CF1. The red light produced by the first wavelength conversion portion WLC1 converting the blue light emitted from the light emitting element layer EML may pass through the first color filter CF1 to be emitted to the outside. Accordingly, the red light may be emitted through the first emission area LA1.

The second wavelength conversion member WLC2 may be disposed in the second emission area LA2 on the first capping layer CAP1. The second wavelength conversion member WLC2 may be surrounded by the first light blocking member BK1. The second wavelength conversion member WLC2 may include a second base resin BS2, a second scatterer SCT2, and a second wavelength shifter WLS2.

The second base resin BS2 may contain a material having a relatively high light transmittance. The second base resin BS2 may be formed of a transparent organic material. For example, the second base resin BS2 and the first base resin BS1 may be made of the same material, or the second base resin BS2 may be made of the material that may form the first base resin BS1.

The second scatterer SCT2 may have a refractive index different from that of the second base resin BS2 and form an optical interface with the second base resin BS2. For example, the second scatterer SCT2 may contain a light scattering material or light scattering particles scattering at least a portion of the transmitted light. For example, the second scatterer SCT2 and the first scatterer SCT1 may be made of the same material, or the second scatterer SCT2 may be made of the material that may form the first scatterer SCT1. The second scatterer SCT2 may scatter the light in random directions regardless of the incidence direction of the incident light without any substantial change of the peak wavelength of the incident light.

The second wavelength shifter WLS2 may change or shift the peak wavelength of the incident light to a second peak wavelength different from the first peak wavelength of the first wavelength shifter WLS1. For example, the second wavelength shifter WLS2 may convert blue light, provided from the display device 10, into green light having a single peak wavelength in a range of about 510 nm to about 550 nm and emit the green light. The second wavelength shifter WLS2 may be a quantum dot, a quantum rod, or a fluorescent substance. The second wavelength shifter WLS2 may contain the materials identical in purpose with the materials enumerated in association with the first wavelength shifter WLS1. The second wavelength shifter WLS2 may be formed of a quantum dot, a quantum rod, or a fluorescent substance to have a wavelength conversion range different from that of the first wavelength shifter WLS1.

The light transmission member LTU may be disposed in the third emission area LA3 on the first capping layer CAP1. The light transmission member LTU may be surrounded by the first light blocking member BK1. The light transmission member LTU may allow the incident light to pass therethrough while maintaining the peak wavelength of the light. The light transmission member LTU may include a third base resin BS3 and a third scatterer SCT3.

The third base resin BS3 may contain a material having a relatively high light transmittance. The third base resin BS3 may be formed of a transparent organic material. For example, the third base resin BS3 and the first base resin BS1 or the second base resin BS2 may be made of the same material, or the third base resin BS3 may be made of the material that may form the first base resin BS1 or the second base resin BS2.

The third scatterer SCT3 may have a refractive index different from that of the third base resin BS3 and form an optical interface with the third base resin BS3. For example, the third scatterer SCT3 may contain a light scattering material or light scattering particles scattering at least a portion of the transmitted light. For example, the third scatterer SCT3 and the first scatterer SCT1 or the second scatterer SCT2 may be formed of the same material, or the third scatterer SCT3 may be made of the material that may form the first scatterer SCT1 or the second scatterer SCT2. The third scatterer SCT3 may scatter the light in random directions regardless of the incidence direction of the incident light without any substantial change of the peak wavelength of the incident light.

Since the wavelength conversion layer WLCL is disposed directly on the second planarization layer 41 of the light emitting element layer EML, the display device 10 may not require a separate substrate for the first and second wavelength conversion members WLC1 and WLC2 and the light transmission member LTU. Accordingly, the first and second wavelength conversion members WLC1 and WLC2 and the light transmission member LTU may be readily aligned in the first to third emission areas LA1, LA2, and LA3, respectively, and the thickness of the display device 10 may be relatively reduced.

The second capping layer CAP2 may cover (or overlap) the first and second wavelength conversion members WLC1 and WLC2, the light transmission member LTU, and the first light blocking member BK1. For example, the second capping layer CAP2 may seal the first and second wavelength conversion members WLC1 and WLC2 and the light transmission member LTU to prevent the first and second wavelength conversion members WLC1 and WLC2 and the light transmission member LTU from damage or contamination. The second capping layer CAP2 and the first capping layer CAP1 may be made of the same material, or the second capping layer CAP2 may be made of the material that may form the first capping layer CAP1.

The third planarization layer 43 may be disposed on the second capping layer CAP2 to planarize top portions of the first and second wavelength conversion members WLC1 and WLC2 and the light transmission member LTU. The third planarization layer 43 may include an organic material. For example, the third planarization layer 43 may include at least one of acrylic resin, epoxy resin, phenolic resin, polyamide resin, or polyimide resin.

The color filter layer CFL may include a second light blocking member BK2, first to third color filters CF1, CF2, and CF3, and a passivation layer PRT.

The second light blocking member BK2 may be disposed in first to third light blocking areas BA1, BA2, and BA3 on the third planarization layer 43 of the wavelength conversion layer WLCL. The second light blocking member BK2 may overlap the first light blocking member BK1 or the second pattern BNL2 in the thickness direction. The second light blocking member BK2 may block transmission of light. The second light blocking member BK2 may prevent light infiltration and color mixture between the first to third emission areas LA1, LA2, and LA3, which leads to the improvement of color reproducibility. The second light blocking member BK2 may be arranged in the form of a grid surrounding the first to third emission areas LA1, LA2, and LA3 in a plan view.

The first color filter CF1 may be disposed in the first emission area LA1 on the third planarization layer 43. The first color filter CF1 may be surrounded by the second light blocking member BK2. The first color filter CF1 may overlap the first wavelength conversion member WLC1 in the thickness direction. The first color filter CF1 may selectively allow the first color light (e.g., red light) to pass therethrough, and may block or absorb the second color light (e.g., green light) and the third color light (e.g., blue light). For example, the first color filter CF1 may be a red color filter and contain a red colorant. The red colorant may include a red dye and/or a red pigment.

The second color filter CF2 may be disposed in the second emission area LA2 on the third planarization layer 43. The second color filter CF2 may be surrounded by the second light blocking member BK2. The second color filter CF2 may overlap the second wavelength conversion member WLC2 in the thickness direction. The second color filter CF2 may selectively allow the second color light (e.g., green light) to pass therethrough, and may block or absorb the first color light (e.g., red light) and the third color light (e.g., blue light). For example, the second color filter CF2 may be a green color filter and contain a green colorant. The green colorant may include a green dye or a green pigment.

The third color filter CF3 may be disposed in the third emission area LA3 on the third planarization layer 43. The third color filter CF3 may be surrounded by the second light blocking member BK2. The third color filter CF3 may overlap the light transmission member LTU in the thickness direction. The third color filter CF3 may selectively allow the third color light (e.g., blue light) to pass therethrough, and may block or absorb the first color light (e.g., red light) and the second color light (e.g., green light). For example, the third color filter CF3 may be a blue color filter and contain a blue colorant. The blue colorant may include a blue dye or a blue pigment.

The first to third color filters CF1, CF2, and CF3 may absorb a portion of the light coming from the outside of the display device 10 to reduce reflected light of the external light. Thus, the first to third color filters CF1, CF2, and CF3 can prevent color distortion caused by the reflection of the external light.

Since the first to third color filters CF1, CF2, and CF3 are directly disposed on the third planarization layer 43 of the wavelength conversion layer WLCL, the display device 10 may not require a separate substrate for the first to third color filters CF1, CF2, and CF3. Therefore, the thickness of the display device 10 may be relatively reduced. However, the disclosure is not limited thereto, and the color filter layer CFL and the wavelength conversion layer WLCL may be formed on a separate substrate and adhered (or attached) to the substrate 11.

The passivation layer PRT may cover (or overlap) the first to third color filters CF1, CF2, and CF3. The passivation layer PRT may protect the first to third color filters CF1, CF2, and CF3.

The encapsulation layer TFE may be disposed on the passivation layer PRT of the color filter layer CFL. The encapsulation layer TFE may cover the top and side surfaces of a display layer. For example, the encapsulation layer TFE may include at least one inorganic layer to prevent permeation of oxygen or moisture. The encapsulation layer TFE may include at least one organic layer to protect the display device 10 from foreign substances such as dust. For example, the encapsulation layer TFE may have a structure in which at least one organic layer is stacked between two inorganic layers. Each of the inorganic layers may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, lithium fluoride, or the like. The organic layer may include acrylic resin, methacrylic resin, polyisoprene, vinyl resin, epoxy resin, urethane resin, cellulose resin, perylene resin, or the like. However, the structure of the encapsulation layer TFE is not limited to the above-described example, and the stacked structure may be variously changed.

Hereinafter, the transistor layer TFTL and the light emitting element layer EML will be described in detail based on a cross-sectional structure of several sub-pixels of the display device according to an embodiment.

Figure 4:
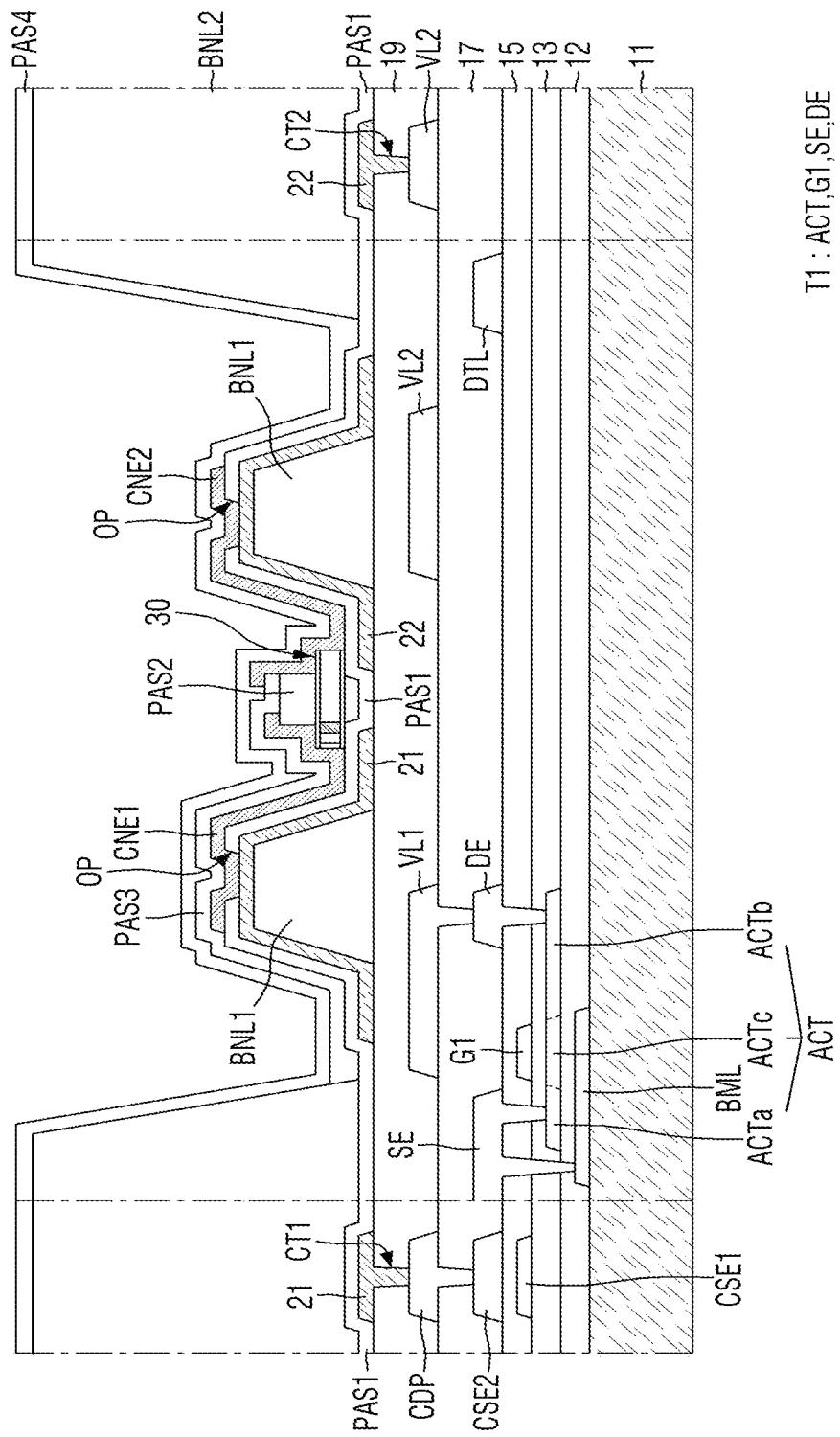
FIG. 4 is a schematic cross-sectional view schematically illustrating a sub-pixel according to an embodiment.

FIG. 4 is a cross-sectional view schematically illustrating a sub-pixel according to an embodiment.

Referring to FIG. 4, the display device 10 may include a substrate 11, and a semiconductor layer, conductive layers, and insulating layers disposed on the substrate 11. The semiconductor layer, the conductive layers, and the insulating layers may each form (or constitute) a circuit layer and a light emitting element layer of the display device 10.

A light blocking layer BML may be disposed on the substrate 11. The light blocking layer BML may be disposed to overlap an active layer ACT of a first transistor T1 of the display device 10. The light blocking layer BML includes a material that blocks light, thereby preventing light from entering the active layer ACT of the first transistor T1. For example, the light blocking layer BML may be formed of an opaque metal material that blocks transmission of light. However, the disclosure is not limited thereto, and in some embodiments, the light blocking layer BML may be omitted. Further, the light blocking layer BML may be electrically connected to the source electrode SE to suppress a change in the voltage of the first transistor T1. Furthermore, the light blocking layer BML may be used as a wire, for example, a power wire, a data wire, a gate wire, or the like.

A buffer layer 12 may be entirely disposed on the substrate 11, including the light blocking layer BML. The buffer layer 12 may be formed on the substrate 11 to protect the first transistors T1 of the pixel PX from moisture permeating through the substrate 11 susceptible to moisture permeation, and may perform a surface planarization function. The buffer layer 12 may be formed as inorganic layers that are alternately stacked. For example, the buffer layer 12 may be formed of a multilayer in which inorganic layers including at least one of silicon oxide ($SiO_x$), silicon nitride ($SiN_x$), and silicon oxynitride ($SiO_xN_y$) are alternately stacked.

The semiconductor layer may be disposed on the buffer layer 12. The semiconductor layer may include the active layer ACT of the first transistor T1. These may be disposed to partially overlap a gate electrode G1 and the like of a first gate conductive layer, which will be described below.

Although FIG. 4 illustrates only the first transistors T1 of the transistors included in the sub-pixel SP of the display device 10, the disclosure is not limited thereto. The display device 10 may include more transistors. For example, the display device 10 may include two or three transistors for each sub-pixel SP by including one or more transistors in addition to the first transistor T1.

The semiconductor layer may include polycrystalline silicon, monocrystalline silicon, oxide semiconductor, and the like. In case that the semiconductor layer includes the oxide semiconductor, each active layer ACT may include conductive regions ACTa and ACTb and a channel region ACTc therebetween. The oxide semiconductor may be an oxide semiconductor containing indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc oxide (IGZO), indium gallium zinc tin oxide (IGZTO) or the like.

In an embodiment, the semiconductor layer may include polycrystalline silicon. The polycrystalline silicon may be formed by crystallizing amorphous silicon. In this case, the conductive regions ACTa and ACTb of the active layer ACT may be doped with impurities.

The gate insulating layer 13 may be disposed on the semiconductor layer and the buffer layer 12. The gate insulating layer 13 may be disposed on the buffer layer 12, including the semiconductor layer. The gate insulating layer 13 may function as a gate insulating layer of each transistor. The gate insulating layer 13 may be formed of an inorganic layer including an inorganic material such as silicon oxide ($SiO_x$), silicon nitride ($SiN_x$) or silicon oxynitride ($SiO_xN_y$), or a stacked structure thereof.

The first gate conductive layer may be disposed on the gate insulating layer 13. The first gate conductive layer may include the gate electrode G1 of the first transistor T1 and a first capacitive electrode CSE1 of a storage capacitor. The gate electrode G1 may be disposed to overlap a channel region ACTc of the active layer ACT in the thickness direction. The first capacitive electrode CSE1 may be disposed to overlap a second capacitive electrode CSE2 to be described below in the thickness direction. In an embodiment, the first capacitive electrode CSE1 may be electrically connected to and integral with the gate electrode G1. The first capacitive electrode CSE1 is disposed to overlap the second capacitive electrode CSE2 in the thickness direction, and a storage capacitor may be formed therebetween.

The first gate conductive layer may be formed as a single layer or multiple layers made of any one of molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

A first interlayer insulating layer 15 may be disposed on the first gate conductive layer. The first interlayer insulating layer 15 may function as an insulating layer between the first gate conductive layer and other layers disposed thereon. Further, the first interlayer insulating layer 15 may be arranged to cover (or overlap) the first gate conductive layer to protect the first gate conductive layer. The first interlayer insulating layer 15 may be formed of an inorganic layer including an inorganic material such as silicon oxide ($SiO_x$), silicon nitride ($SiN_x$), or silicon oxynitride ($SiO_xN_y$), or a stacked structure thereof.

A first data conductive layer may be disposed on the first interlayer insulating layer 15. The first data conductive layer may include a first source electrode SE and a first drain electrode DE of the first transistor T1, a data line DTL, and the second capacitive electrode CSE2.

The first source electrode SE and the first drain electrode DE of the first transistor T1 may respectively contact doped regions ACTa and ACTb of the active layer ACT via contact holes penetrating the first interlayer insulating layer 15 and the gate insulating layer 13. Further, the first source electrode SE of the first transistor T1 may be electrically connected to the light blocking layer BML through another contact hole.

The data line DTL may apply a data signal to another transistor (not shown) included in the display device 10. Although not illustrated in the drawing, the data line DTL may be electrically connected to a source/drain electrode of another transistor to transfer a signal applied from the data line DTL.

The second capacitive electrode CSE2 may be disposed to overlap the first capacitive electrode CSE1 in the thickness direction. In an embodiment, the second capacitive electrode CSE2 may be connected integrally (or integral) with the first source electrode SE.

The first data conductive layer may be formed as a single layer or multiple layers made of one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

A second interlayer insulating layer 17 may be disposed on the first data conductive layer. The second interlayer insulating layer 17 may function as an insulating layer between the first data conductive layer and other layers disposed thereon. The second interlayer insulating layer 17 may cover (or overlap) the first data conductive layer and function to protect the first data conductive layer. The second interlayer insulating layer 17 may be formed of an inorganic layer including an inorganic material such as silicon oxide ($SiO_x$), silicon nitride ($SiN_x$), or silicon oxynitride ($SiO_xN_y$), or a stacked structure thereof.

A second data conductive layer may be disposed on the second interlayer insulating layer 17. The second data conductive layer may include a first voltage wire VL1, a second voltage wire VL2, and a first conductive pattern CDP. The first voltage wire VL1 may be applied with a high potential voltage (or a first power voltage) supplied to the first transistor T1, and the second voltage wire VL2 may be applied with a low potential voltage (or a second power voltage) supplied to the second electrode 22. During the manufacturing process of the display device 10, the second voltage wire VL2 may be applied with an alignment signal required to align the light emitting elements 30.

The first conductive pattern CDP may be electrically connected to a second capacitive electrode CSE2 through a contact hole formed in the second interlayer insulating layer 17. The second capacitive electrode CSE2 may be integral with the first source electrode SE of the first transistor T1, and the first conductive pattern CDP may be electrically connected to the first source electrode SE. The first conductive pattern CDP may also contact a first electrode 21 to be described below, and the first transistor T1 may transfer the first power voltage, applied from the first voltage wire VL1, to the first electrode 21 through the first conductive pattern CDP. Although it is illustrated in the drawing that the second data conductive layer includes a second voltage wire VL2 and a first voltage wire VL1, the disclosure is not limited thereto. The second data conductive layer may include a larger number of first voltage wires VL1 and second voltage wires VL2. However, the disclosure is not limited thereto, and the first data conductive layer may serve to transmit a signal such as a power voltage, and in this case, the second data conductive layer may be omitted.

The second data conductive layer may be formed as a single layer or multiple layers made of any one of molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

A first planarization layer 19 may be disposed on the second data conductive layer. The first planarization layer 19 may include an organic insulating material, for example, an organic material such as polyimide (PI), to perform a surface planarization function.

A plurality of first patterns BNL1, electrodes 21 and 22, the light emitting element 30, connection electrodes CNE1 and CNE2, and the second pattern BNL2 may be disposed on the first planarization layer 19. Further, insulating layers PAS1, PAS2, PAS3, and PAS4 may be disposed on the first planarization layer 19. The insulating layers PAS1, PAS2, PAS3, and PAS4 may include first to fourth insulating layers PAS1 to PAS4.

The first patterns BNL1 may be directly disposed on the first planarization layer 19. The first patterns BNL1 may extend in the second direction DR2 within each sub-pixel SP without extending to another sub-pixel SP adjacent in the second direction DR2. The first patterns BNL1 may be disposed to be spaced apart from each other in the first direction DR1, and the light emitting element 30 may be disposed therebetween. The first patterns BNL1 may be disposed for each sub-pixel SP to form a linear pattern in the display area DPA of the display device 10. In the drawing, two first patterns BNL1 are illustrated, but the disclosure is not limited thereto. A larger number of first patterns BNL1 may be disposed depending on the number of the electrodes 21 and 22.

The first pattern BNL1 may have a structure in which at least a portion thereof protrudes from the top surface of the first planarization layer 19. The protruding portion of the first pattern BNL1 may have an inclined side surface, and the light emitted from the light emitting element 30 may be reflected from the electrodes 21 and 22 disposed on the first pattern BNL1 to be emitted in an upward direction of the first planarization layer 19. The first pattern BNL1 may provide an area in which the light emitting element 30 is disposed, and may also function as a reflective partition wall that reflects light emitted from the light emitting element 30 upward. The side surface of the first pattern BNL1 may be inclined in a linear shape, but the disclosure is not limited thereto, and the outer surface of the first pattern BNL1 may have a curved semi-circle or semi-ellipse shape. The first patterns BNL1 may include an organic insulating material such as polyimide (PI), but the disclosure is not limited thereto.

The electrodes 21 and 22 may be disposed on the first pattern BNL1 and the first planarization layer 19. The electrodes 21 and 22 may include a first electrode 21 and a second electrode 22. The first electrode 21 and the second electrode 22 may extend in the second direction DR2 and may be disposed to be spaced from each other in the first direction DR1.

Each of the first electrode 21 and the second electrode 22 may extend in the second direction DR2 within the sub-pixel SP. The first electrode 21 and the second electrode 22 may be separated between the sub-pixels SP adjacent in the second direction DR2. However, the disclosure is not limited thereto, and some of the electrodes 21 and 22 may be arranged to extend beyond the adjacent sub-pixel SP in the second direction DR2 without being separated for each sub-pixel SP, or only one of the first electrode 21 and the second electrode 22 may be separated.

The first electrode 21 may be electrically connected to the first transistor T1 through a first contact hole CT1, and the second electrode 22 may be electrically connected to the second voltage wire VL2 through a second contact hole CT2. For example, the first electrode 21 may contact the first conductive pattern CDP through the first contact hole CT1 penetrating the first planarization layer 19 in a portion of the second pattern BNL2 extending in the first direction DR1. The second electrode 22 may contact the second voltage wire VL2 through the second contact hole CT2 penetrating the first planarization layer 19 in the portion of the second pattern BNL2 extending in the first direction DR1. However, the disclosure is not limited thereto. In an embodiment, the second electrode 22 may directly contact a first data wiring layer, so that a voltage may be applied to the second electrode 22.

FIG. 4 illustrates that a first electrode 21 and a second electrode 22 are disposed for each sub-pixel SP, but the disclosure is not limited thereto, and a larger number of the first electrodes 21 and a larger number of the second electrodes 122 may be disposed in the sub-pixel SP. The first electrode 21 and the second electrode 22 disposed in each sub-pixel SP may not extend in a direction, and the first electrode 21 and the second electrode 22 may be arranged in various structures. For example, the first electrode 21 and the second electrode 22 may have a partially curved or bent shape, and one thereof may be disposed to surround the other.

The first electrode 21 and the second electrode 22 may be directly disposed on the first patterns BNL1. Each of the first electrode 21 and the second electrode 22 may be formed to have a larger width than that of the first pattern BNL1. For example, each of the first electrode 21 and the second electrode 22 may be disposed to cover (or overlap) the outer surface of the first pattern BNL1. The first electrode 21 and the second electrode 22 may be disposed on the side surfaces of the first pattern BNL1, respectively, and a distance between the first electrode 21 and the second electrode 22 may be smaller than a distance between the first patterns BNL1. Further, at least a portion of the first electrode 21 and at least a portion of the second electrode 22 are directly disposed on the first planarization layer 19, so that they may be disposed on the same plane. However, the disclosure is not limited thereto. In some embodiments, each of the electrodes 21 and 22 may have a width smaller than that of the first pattern BNL1. However, each of the electrodes 21 and 22 may be disposed to cover at least one side surface of the first pattern BNL1 to reflect light emitted from the light emitting element 30.

Each electrode 21, 22 may include a conductive material having high reflectivity. For example, each electrode 21, 22 may include a metal such as silver (Ag), copper (Cu), or aluminum (Al) as a material having high reflectivity, or may be an alloy including aluminum (Al), nickel (Ni), lanthanum (La), and the like. Each electrode 21, 22 may reflect, in the upward direction of each sub-pixel SP, light emitted from the light emitting element 30 and traveling to the side surface of the first pattern BNL1.

However, the disclosure is not limited thereto, and each of the electrodes 21 and 22 may further include a transparent conductive material. For example, each electrode 21, 22 may include a material such as indium tin oxide (ITO), indium zinc oxide (IZO), and indium tin zinc oxide (ITZO). In some embodiments, each of the electrodes 21 and 22 may have a structure in which at least one transparent conductive material and at least one metal layer having high reflectivity are stacked, or may be formed as a layer including them. For example, each electrode 21, 22 may have a stacked structure such as ITO/silver (Ag)/ITO, ITO/Ag/IZO, or ITO/Ag/ITZO/IZO.

The electrodes 21 and 22 may be electrically connected to the light emitting elements 30 and may be applied with a predetermined voltage to allow the light emitting elements 30 to emit light. For example, the electrodes 21 and 22 may be electrically connected to the light emitting elements 30 through the connection electrodes CNE1 and CNE2 to be described below, and electrical signals applied to the electrodes 21 and 22 may be transferred to the light emitting elements 30 through the connection electrodes CNE1 and CNE2.

One of the first electrode 21 and the second electrode 22 may be electrically connected to an anode electrode of the light emitting element 30, and another thereof may be electrically connected to a cathode electrode of the light emitting element 30. However, the disclosure is not limited thereto, and an opposite case may also be possible.

Further, each of the electrodes 21 and 22 may be used to form an electric field in the sub-pixel SP to align the light emitting elements 30. The light emitting elements 30 may be disposed between the first electrode 21 and the second electrode 22 by an electric field formed on the first electrode 21 and the second electrode 22. The light emitting elements 30 of the display device 10 may be injected or sprayed onto the electrodes 21 and 22 by an inkjet printing process. In case that inks including the light emitting elements 30 are sprayed onto the electrodes 21 and 22, an alignment signal is applied to the electrodes 21 and 22 to generate an electric field. The light emitting elements 30 dispersed in the inks may be aligned on the electrodes 21 and 22 by receiving a dielectrophoretic force by the electric field generated on the electrodes 21 and 22.

The first insulating layer PAS1 may be disposed on the first planarization layer 19. The first insulating layer PAS1 may be disposed to cover (or overlap) the first patterns BNL1 and the first and second electrodes 21 and 22. The first insulating layer PAS1 may protect the first electrode 21 and the second electrode 22 while insulating them from each other. Further, it may be possible to prevent the light emitting element 30, disposed on the first insulating layer PAS1, from being damaged by directly contacting other members.

In an embodiment, the first insulating layer PAS1 may include an opening OP partially exposing the first electrode 21 and the second electrode 22. The respective openings OP may partially expose portions of the electrodes 21 and 22 disposed on the top surface of the first pattern BNL1. Portions of the connection electrodes CNE1 and CNE2 may contact the electrodes 21 and 22 exposed through the opening OP, respectively.

The first insulating layer PAS1 may be formed to have a step such that a portion of the top surface thereof is recessed between the first electrode 21 and the second electrode 22. For example, as the first insulating layer PAS1 is disposed to cover the first electrode 21 and the second electrode 22, the top surface thereof may have a stepped portion that has a step or height difference according to the shapes of the electrodes 21 and 22 disposed thereunder. However, the disclosure is not limited thereto.

The second pattern BNL2 may be disposed on the first insulating layer PAS1. The second pattern BNL2 may include portions extending in the first direction DR1 and the second direction DR2 in a plan view to be arranged in a grid pattern over the entire surface of the display area DPA. The second pattern BNL2 may be disposed along the boundaries between the sub-pixels SP to delimit the neighboring sub-pixels SP. The first electrode 21 and the second electrode 22 may extend in the second direction DR2 to be disposed across a portion of the second pattern BNL2 extending in the first direction DR1.

The second pattern BNL2 may be formed to have a height greater than that of the first bank BNL1. The second pattern BNL2 may prevent ink from overflowing into the adjacent sub-pixels SP during the inkjet printing process of the manufacturing process of the display device 10, thereby separating inks in which different light emitting elements 30 are dispersed for the corresponding sub-pixels SP such that the inks are not mixed. Similar to the first pattern BNL1, the second pattern BNL2 may include polyimide (PI), but the disclosure is not limited thereto.

The light emitting element 30 may be disposed on the first insulating layer PAS1. The light emitting elements 30 may be disposed to be spaced from each other in the second direction DR2 in which the electrodes 21 and 22 extend, and may be aligned substantially parallel to each other. The light emitting element 30 may extend in a direction, and the extension direction of the light emitting element 30 may be substantially perpendicular to the extension direction of the electrodes 21 and 22. However, the disclosure is not limited thereto, and the light emitting element 30 may be disposed obliquely without being perpendicular to the extension direction of the electrodes 21 and 22. The light emitting elements 30 disposed in each sub-pixel SP may be of the same type to emit light of substantially the same color. In an embodiment, each of the light emitting elements 30 may emit blue light.

Between the first patterns BNL1, the light emitting element 30 may have both ends respectively disposed above the electrodes 21 and 22. The length of the light emitting element 30 may be longer than the distance between the first electrode 21 and the second electrode 22, and both ends of the light emitting element 30 may be respectively disposed above the first electrode 21 and the second electrode 22. For example, the light emitting element 30 may be disposed such that a first end is placed above the first electrode 21 and a second end is placed above the second electrode 22.

The light emitting element 30 may be provided with layers disposed in a direction perpendicular to the top surface of the substrate 11 or the first planarization layer 19. The light emitting element 30 may be disposed such that an extension direction is parallel to the top surface of the first planarization layer 19, and the semiconductor layers included in the light emitting element 30 may be sequentially arranged in a direction parallel to the top surface of the first planarization layer 19. However, the disclosure is not limited thereto, and in case that the light emitting element 30 has a different structure, the semiconductor layers may be disposed in a direction perpendicular to the top surface of the first planarization layer 19.

Both ends of the light emitting element 30 may contact respective connection electrodes CNE1 and CNE2. For example, on the end surface of the light emitting element 30 extending in a direction, an insulating layer 38 (see FIG. 5) is not formed, and a portion of a semiconductor layer 31, 32 (see FIG. 5) or a portion of an electrode layer 37 (see FIG. 5) may be exposed, and the exposed semiconductor layer 31, 32 (see FIG. 5) or the electrode layer 37 (see FIG. 5) may contact the connection electrode CNE1, CNE2. However, the disclosure is not limited thereto, and at least a portion of the insulating layer 38 may be removed from the light emitting element 30 to partially expose the side surfaces of both ends of the semiconductor layers 31 and 32 (see FIG. 5). The exposed side surfaces of the semiconductor layers 31 and 32 (see FIG. 5) may directly contact the connection electrodes CNE1 and CNE2.

The second insulating layer PAS2 may be partially disposed on the light emitting element 30. For example, the second insulating layer PAS2 may have a width smaller than the length of the light emitting element 30 and be disposed on the light emitting element 30 to expose both ends of the light emitting element 30 while surrounding the light emitting element 30. During the manufacturing process of the display device 10, the second insulating layer PAS2 may be disposed to cover (or overlap) the light emitting element 30, the electrodes 21 and 22, and the first insulating layer PAS1 and may be partially removed to expose both ends of the light emitting element 30. The second insulating layer PAS2 may be disposed on the first insulating layer PAS1 to extend in the second direction DR2 in a plan view, thereby forming a linear or island-like pattern in each sub-pixel SP. The second insulating layer PAS2 may protect the light emitting element 30 while fixing the light emitting element 30 during the manufacturing process of the display device 10.

The connection electrodes CNE1 and CNE2 and the third insulating layer PAS3 may be arranged on the second insulating layer PAS2.

The connection electrodes CNE1 and CNE2 may extend in a direction and may be disposed on the electrodes 21 and 22, respectively. The connection electrodes CNE1 and CNE2 may include a first connection electrode CNE1 disposed on the first electrode 21 and a second connection electrode CNE2 disposed on the second electrode 22. The connection electrodes CNE1 and CNE2 may be disposed to be spaced apart from each other or opposite to each other. For example, the first connection electrode CNE1 and the second connection electrode CNE2 may be disposed on the first electrode 21 and the second electrode 22, respectively, so as to be spaced apart from each other in the first direction DR1. Each of the connection electrodes CNE1 and CNE2 may form a stripe pattern in each sub-pixel SP.

The connection electrodes CNE1 and CNE2 may each contact the light emitting element 30. The first connection electrode CNE1 may contact a first end of the light emitting element 30, and the second connection electrode CNE2 may contact a second end of the light emitting element 30. The semiconductor layers are exposed on both end surfaces of the light emitting element 30 in its extension direction, and the connection electrodes CNE1 and CNE2 may contact the semiconductor layers of the light emitting element 30 to be electrically connected thereto. One side (or a first side) of each of the connection electrodes CNE1 and CNE2 that contacts either end of the light emitting element 30 may be disposed on the second insulating layer PAS2. The first connection electrode CNE1 may contact the first electrode 21 through the opening OP exposing a portion of the top surface of the first electrode 21, and the second connection electrode CNE2 may contact the second electrode 22 through the opening OP exposing a portion of the top surface of the second electrode 22.

The widths of the connection electrodes CNE1 and CNE2 measured in a direction may be smaller than the widths of the electrodes 21 and 22 measured in the direction, respectively. The connection electrodes CNE1 and CNE2 may be disposed not only to contact a first end and a second end of the light emitting element 30, respectively, but also to cover (or overlap) a portion of the top surface of the first electrode 21 and a portion of the top surface of the second electrode 22, respectively. However, the disclosure is not limited thereto, and the connection electrodes CNE1 and CNE2 may have widths greater than those of the electrodes 21 and 22 to cover both sides of the electrodes 21 and 22.

The connection electrodes CNE1 and CNE2 may include a transparent conductive material. For example, they may include ITO, IZO, ITZO, aluminum (Al), or the like. Light emitted from the light emitting element 30 may pass through the connection electrodes CNE1 and CNE2 and travel toward the electrodes 21 and 22. However, the disclosure is not limited thereto.

In the drawing, it is illustrated that two connection electrodes CNE1 and CNE2 are arranged in a sub-pixel SP, but the disclosure is not limited thereto. The number of the connection electrodes CNE1 and CNE2 may vary depending on the number of the electrodes 21 and 22 disposed in each sub-pixel SP.

The third insulating layer PAS3 may be disposed to cover the first connection electrode CNE1. The third insulating layer PAS3 may be disposed to cover, in addition to the first connection electrode CNE1, a side at which the first connection electrode CNE1 is disposed with respect to the second insulating layer PAS2. For example, the third insulating layer PAS3 may be disposed to cover the first connection electrode CNE1 and the first insulating layer PAS1 disposed on the first electrode 21. This arrangement may be formed by a process of entirely disposing an insulating material layer forming (or constituting) the third insulating layer PAS3 and then partially removing the insulating material layer in order to form the second connection electrode CNE2. In the above process, the insulating material layer forming the third insulating layer PAS3 may be removed together with an insulating material layer forming the second insulating layer PAS2, and a side of the third insulating layer PAS3 may be aligned with a side of the second insulating layer PAS2. The second connection electrode CNE2 may have a side disposed on the third insulating layer PAS3 and may be insulated from the first connection electrode CNE1 with the third insulating layer PAS3 interposed therebetween.

The fourth insulating layer PAS4 may be entirely disposed in the display area DPA of the substrate 11. The fourth insulating layer PAS4 may function to protect members, disposed on the substrate 11, from an external environment. However, the fourth insulating layer PAS4 may be omitted.

Each of the first insulating layer PAS1, the second insulating layer PAS2, the third insulating layer PAS3, and the fourth insulating layer PAS4 described above may include an inorganic insulating material or an organic insulating material. For example, the first insulating layer PAS1, the second insulating layer PAS2, the third insulating layer PAS3, and the fourth insulating layer PAS4 may include an inorganic insulating material such as silicon oxide ($SiO_x$), silicon nitride ($SiN_x$), silicon oxynitride ($SiO_xN_y$), aluminum oxide ($Al_xO_y$), or aluminum nitride (AlN). As another example, they may include an organic insulating material such as acrylic resin, epoxy resin, phenolic resin, polyamide resin, polyimide resin, unsaturated polyester resin, polyphenylene resin, polyphenylenesulfide resin, benzocyclobutene, cardo resin, siloxane resin, silsesquioxane resin, polymethylmethacrylate, polycarbonate, polymethylmethacrylate-polycarbonate synthetic resin, and the like. However, the disclosure is not limited thereto.

Figure 5:
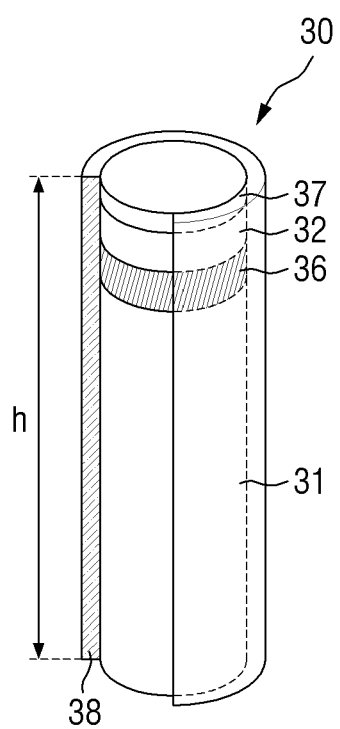
FIG. 5 is a schematic diagram of a light emitting element according to an embodiment.

FIG. 5 is a schematic diagram of a light emitting element according to an embodiment.

Referring to FIG. 5, the light emitting element 30 which is a particulate element may have a rod or cylindrical shape having a predetermined aspect ratio. The light emitting element 30 may have a size of a nanometer scale (equal to or greater than about 1 nm and less than about 1 μm) to a micrometer scale (equal to or greater than about 1 μm and less than about 1 mm). In an embodiment, both the diameter and the length h of the light emitting element 30 may be on a nanometer scale, or on a micrometer scale. In some embodiments, the diameter of the light emitting element 30 may be on a nanometer scale, while the length h of the light emitting element 30 may be on a micrometer scale. In some embodiments, some of the light emitting elements 30 may have a diameter and/or length h on a nanometer scale, while some others of the light emitting elements 30 may have a diameter and/or length h on a micrometer scale.

In an embodiment, the light emitting element 30 may be an inorganic light emitting diode. Specifically, the light emitting element 30 may include a semiconductor layer doped with impurities of a conductivity type (e.g., a p- or n-type). The semiconductor layer may emit light of a specific wavelength band by receiving an electrical signal applied from an external power source.

The light emitting element 30 according to an embodiment may include a first semiconductor layer 31, an active layer 33, a second semiconductor layer 32, and an electrode layer 37 sequentially stacked in a longitudinal direction. The light emitting element may further include an insulating layer 38 covering (or overlapping) the outer surfaces of the first semiconductor layer 31, the second semiconductor layer 32, and the active layer 33.

The first semiconductor layer 31 may be an n-type semiconductor. In case that the light emitting element 30 emits light of a blue wavelength band, the first semiconductor layer 31 may include a semiconductor material having a chemical formula of $Al_xGa_yIn_{1-x-y}N$ (0≤x≤1, 0≤y≤1, 0≤x+y≤1). For example, it may be one or more of n-type doped AlGaInN, GaN, AlGaN, InGaN, AlN, and InN. The first semiconductor layer 31 may be doped with an n-type dopant, and the n-type dopant may be Si, Ge, or Sn. For example, the first semiconductor layer 31 may be n-GaN doped with n-type Si. The length of the first semiconductor layer 31 may have a range of about 1.5 μm to about 5 but the disclosure is not limited thereto.

The second semiconductor layer 32 may be disposed on a light emitting layer 36 to be described below. The second semiconductor layer 32 may be a p-type semiconductor. In case that the light emitting element 30 emits light of a blue or green wavelength band, the second semiconductor layer 32 may include a semiconductor material having a chemical formula of $Al_xGa_yIn_{1-x-y}N$ (0≤x≤1, 0≤y≤1, 0≤x+y≤1). For example, it may be any one or more of p-type doped AlGaInN, GaN, AlGaN, InGaN, AlN, and InN. The second semiconductor layer 32 may be doped with a p-type dopant, and the p-type dopant may be Mg, Zn, Ca, Se, Ba, or the like. For example, the second semiconductor layer 32 may be p-GaN doped with p-type Mg. The length of the second semiconductor layer 32 may have a range of about 0.05 μm to about 0.10 but the disclosure is not limited thereto.

Although it is illustrated in the drawing that the first semiconductor layer 31 and the second semiconductor layer 32 are configured as A layer, the disclosure is not limited thereto. Depending on the material of the light emitting layer 36, the first semiconductor layer 31 and the second semiconductor layer 32 may further include a larger number of layers such as a cladding layer or a tensile strain barrier reducing (TSBR) layer.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, quantum layers and well layers may be stacked alternately. The light emitting layer 36 may emit light by coupling of electron-hole pairs according to an electrical signal applied through the first semiconductor layer 31 and the second semiconductor layer 32. In case that the light emitting layer 36 emits light of a blue wavelength band, a material such as AlGaN or AlGaInN may be included. In case that the light emitting layer 36 has a structure in which quantum layers and well layers are alternately stacked in a multiple quantum well structure, the quantum layer may include a material such as AlGaN or AlGaInN, and the well layer may include a material such as GaN or AlInN. For example, as described above, the light emitting layer 36 may include AlGaInN as a quantum layer and AlInN as a well layer, and the light emitting layer 36 may emit blue light having a central wavelength band of about 450 nm to about 495 nm.

However, the disclosure is not limited thereto, and the light emitting layer 36 may have a structure in which semiconductor materials having large band gap energy and semiconductor materials having small band gap energy are alternately stacked, and may include other group III to V semiconductor materials according to the wavelength band of the emitted light. The light emitted by the light emitting layer 36 is not limited to light of a blue wavelength band, but the active layer 36 may also emit light of a red or green wavelength band in some embodiments. The length of the light emitting layer 36 may have a range of about 0.05 μm to about 0.10 μm, but the disclosure is not limited thereto.

Light emitted from the light emitting layer 36 may be emitted to both side surfaces as well as the outer surface of the light emitting element 30 in a longitudinal direction. The directionality of light emitted from the light emitting layer 36 is not limited to a direction.

The electrode layer 37 may be an ohmic connection electrode. However, the disclosure is not limited thereto, and it may be a Schottky connection electrode. The light emitting element 30 may include at least one electrode layer 37. Although FIG. 5 illustrates that the light emitting element 30 includes an electrode layer 37, the disclosure is not limited thereto. In some embodiments, the light emitting element 30 may include a larger number of electrode layers 37 or may be omitted. The following description of the light emitting element 30 may be equally applied even if the number of electrode layers 37 is different or the electrode layer 37 further includes other structures.

In the display device 10 according to an embodiment, in case that the light emitting element 30 is electrically connected to an electrode or a connection electrode, the electrode layer 37 may reduce the resistance between the light emitting element 30 and the electrode or connection electrode. The electrode layer 37 may include conductive metal. For example, the electrode layer 37 may include at least one of aluminum (Al), titanium (Ti), indium (In), gold (Au), silver (Ag), indium tin oxide (ITO), indium zinc oxide (IZO), or indium tin zinc oxide (ITZO). Further, the electrode layer 37 may include an n-type or p-type doped semiconductor material. The electrode layer 37 may include the same material or different materials, but the disclosure is not limited thereto.

The insulating layer 38 may be arranged to surround the outer surfaces of the semiconductor layers and electrode layers described above. For example, the insulating layer 38 may be disposed to surround at least the outer surface of the light emitting layer 36 and may extend in a direction in which the light emitting element 30 extends. The insulating layer 38 may function to protect the above-discussed members (e.g., semiconductor layers 31 and 32, the active layer 33, the light emitting layer 36, and the electrode layer 37). The insulating layer 38 may be formed to surround side surfaces of the above-discussed members to expose both ends of the light emitting element 30 in the longitudinal direction.

Although it is illustrated in the drawing that the insulating layer 38 extends in the longitudinal direction of the light emitting element 30 to cover (or overlap) a region from the first semiconductor layer 31 to the side surface of the electrode layer 37, the disclosure is not limited thereto. The insulating layer 38 may include the light emitting layer 36 to cover only the outer surfaces of a part of the semiconductor layers, or may cover only a portion of the outer surface of the electrode layer 37 to partially expose the outer surface of each electrode layer 37. In a cross-sectional view, the insulating layer 38 may have a top surface, which is rounded in a region adjacent to at least one end of the light emitting element 30.

The thickness of the insulating layer 38 may have a range of about 10 nm to about 1.0 μm, but the disclosure is not limited thereto. The thickness of the insulating layer 38 may be about 40 nm.

The insulating layer 38 may include materials having insulating properties, for example, silicon oxide ($SiO_x$), silicon nitride ($SiN_x$), silicon oxynitride ($SiO_xN_y$), aluminum nitride (AlN), aluminum oxide ($Al_xO_y$), and the like. The insulating layer 38 may be formed as a single layer or multiple layers of materials having insulating properties. Accordingly, it is possible to prevent an electrical short circuit that may occur in case that the light emitting layer 36 directly contacts the electrode through which the electrical signal is transmitted to the light emitting element 30. Since the insulating layer 38 includes the light emitting layer 36 to protect the outer surface of the light emitting element 30, it is possible to prevent degradation in light emission efficiency.

Further, the insulating layer 38 may have an outer surface which is surface-treated. The light emitting elements 30 may be sprayed onto the electrode in a state of being dispersed in predetermined ink to be aligned. Here, the surface of the insulating layer 38 may be treated in a hydrophobic or hydrophilic manner in order to keep the light emitting elements 30 in a dispersed state without aggregating with other light emitting elements 30 adjacent in the ink. For example, the insulating layer 38 may be surface-treated on the outer surface thereof with a material such as stearic acid and 2,3-naphthalene dicarboxylic acid.

Hereinafter, the arrangement of the aforementioned pixels will be described in detail with reference to other drawings.

Figure 6:
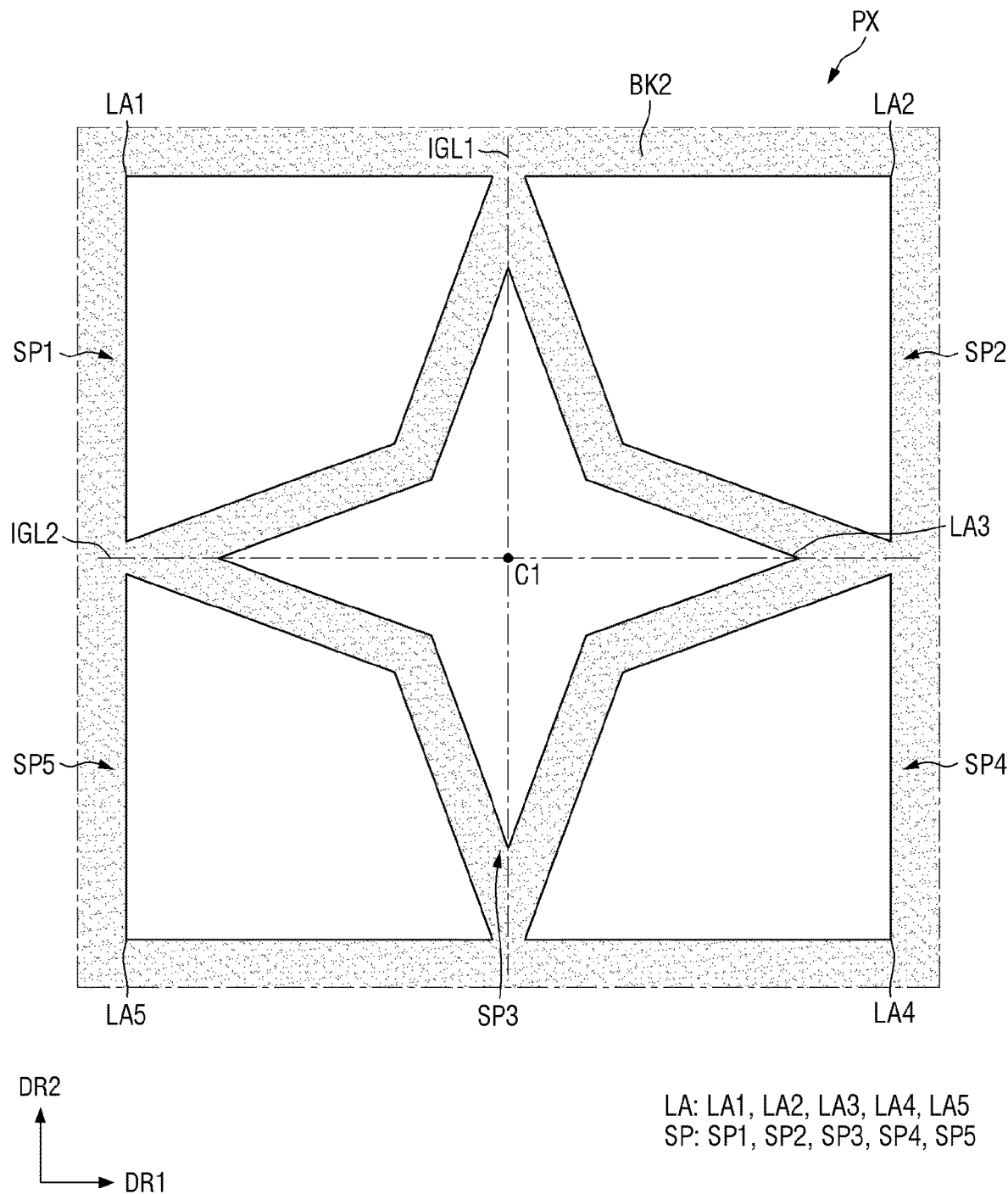
FIG. 6 is a schematic plan view illustrating a pixel according to an embodiment.
Figure 7:
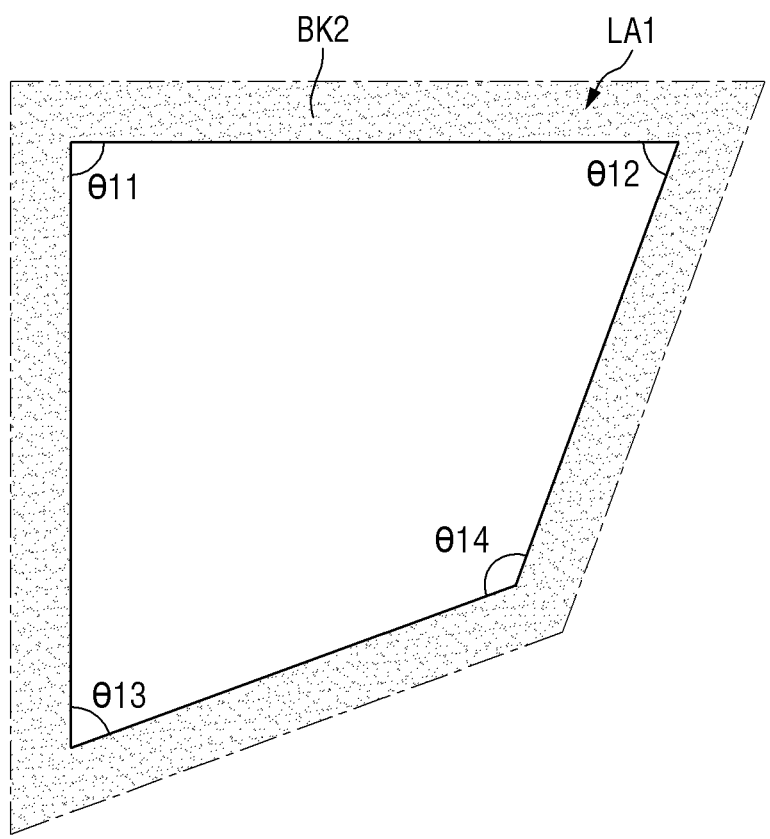
FIG. 7 is a schematic plan view illustrating a first sub-pixel according to an embodiment.
Figure 8:
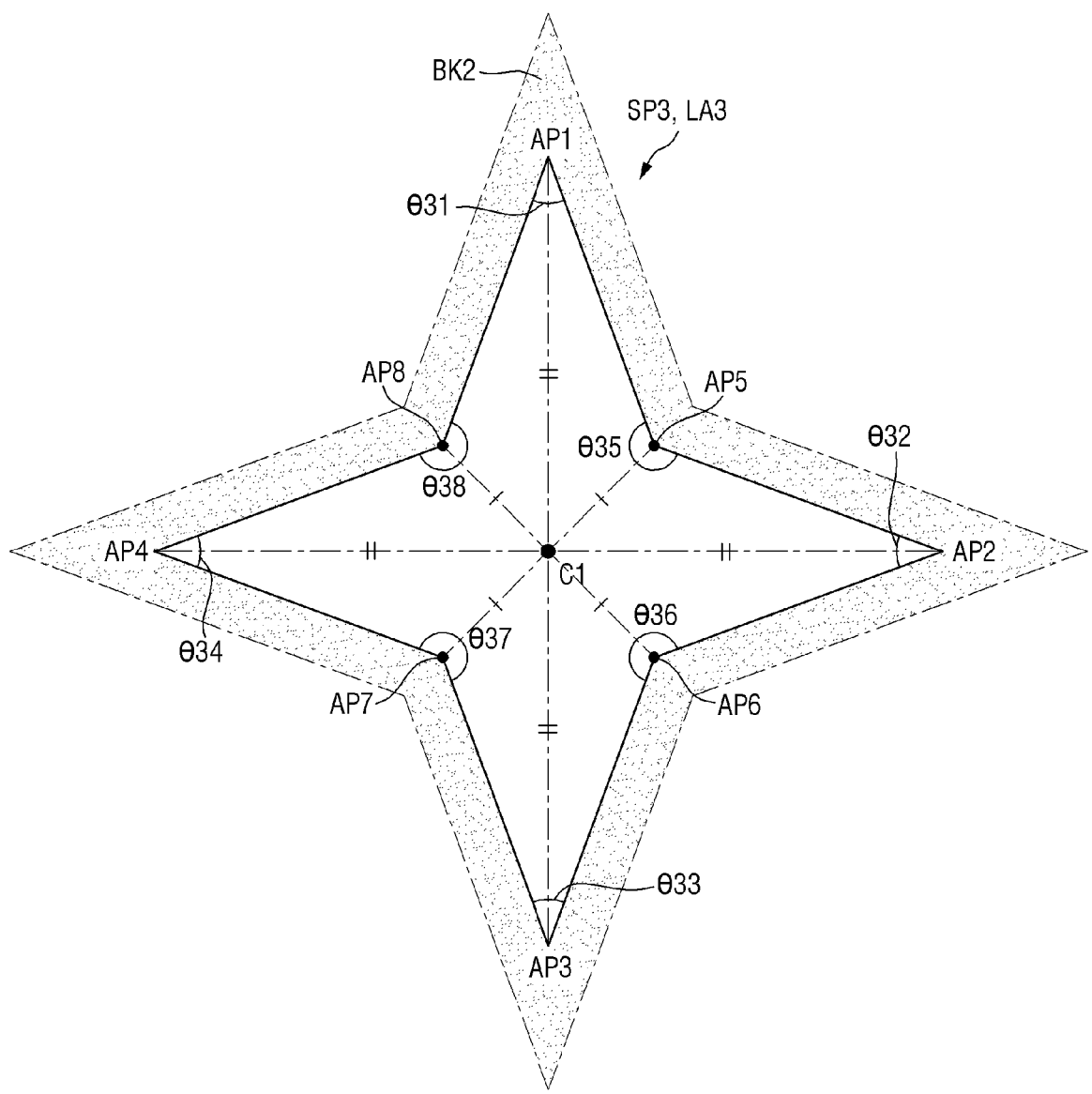
FIG. 8 is a schematic plan view illustrating a third sub-pixel according to an embodiment.
Figure 9:
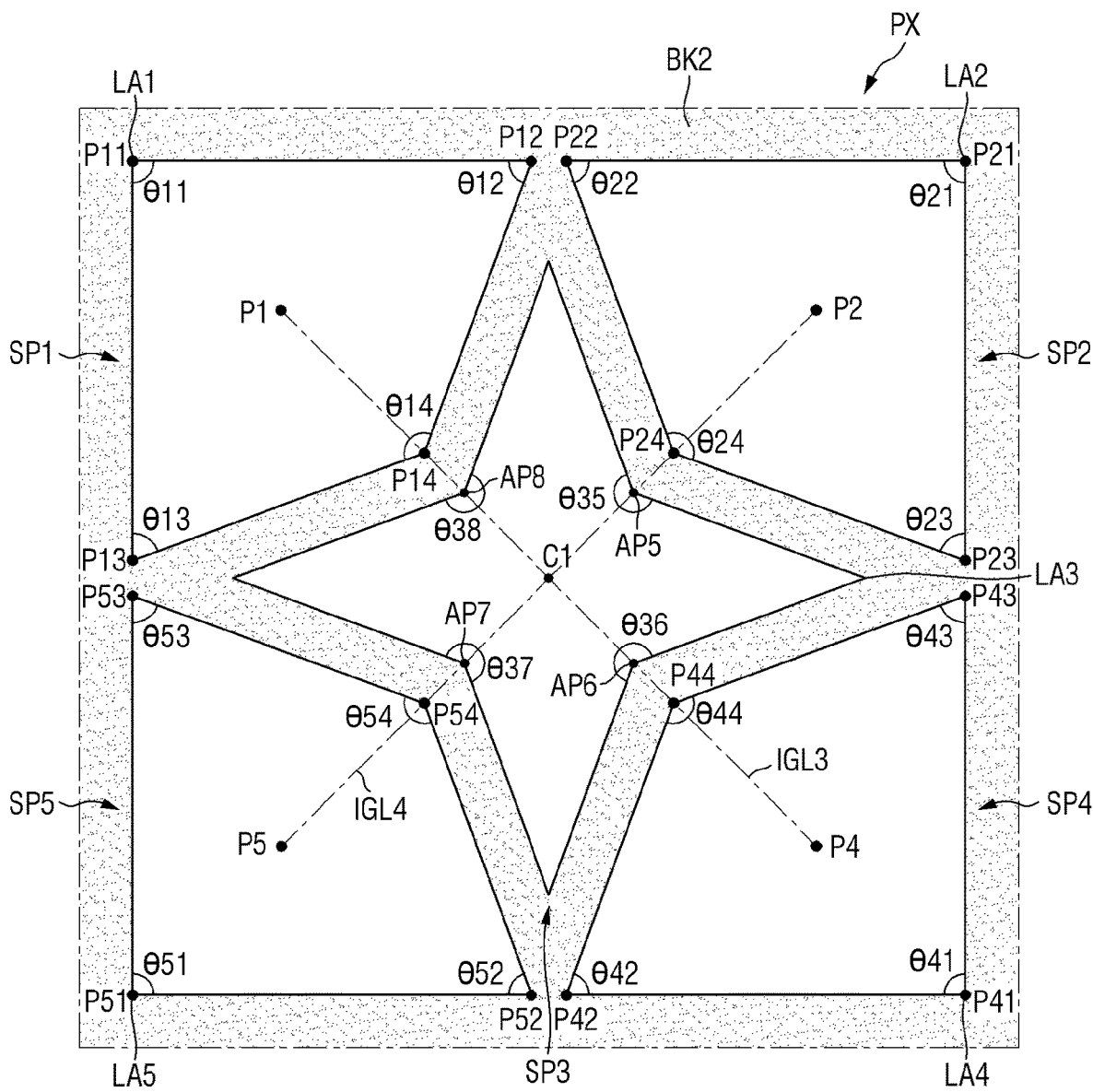
FIG. 9 is a schematic plan view illustrating a pixel according to an embodiment.
Figure 10:
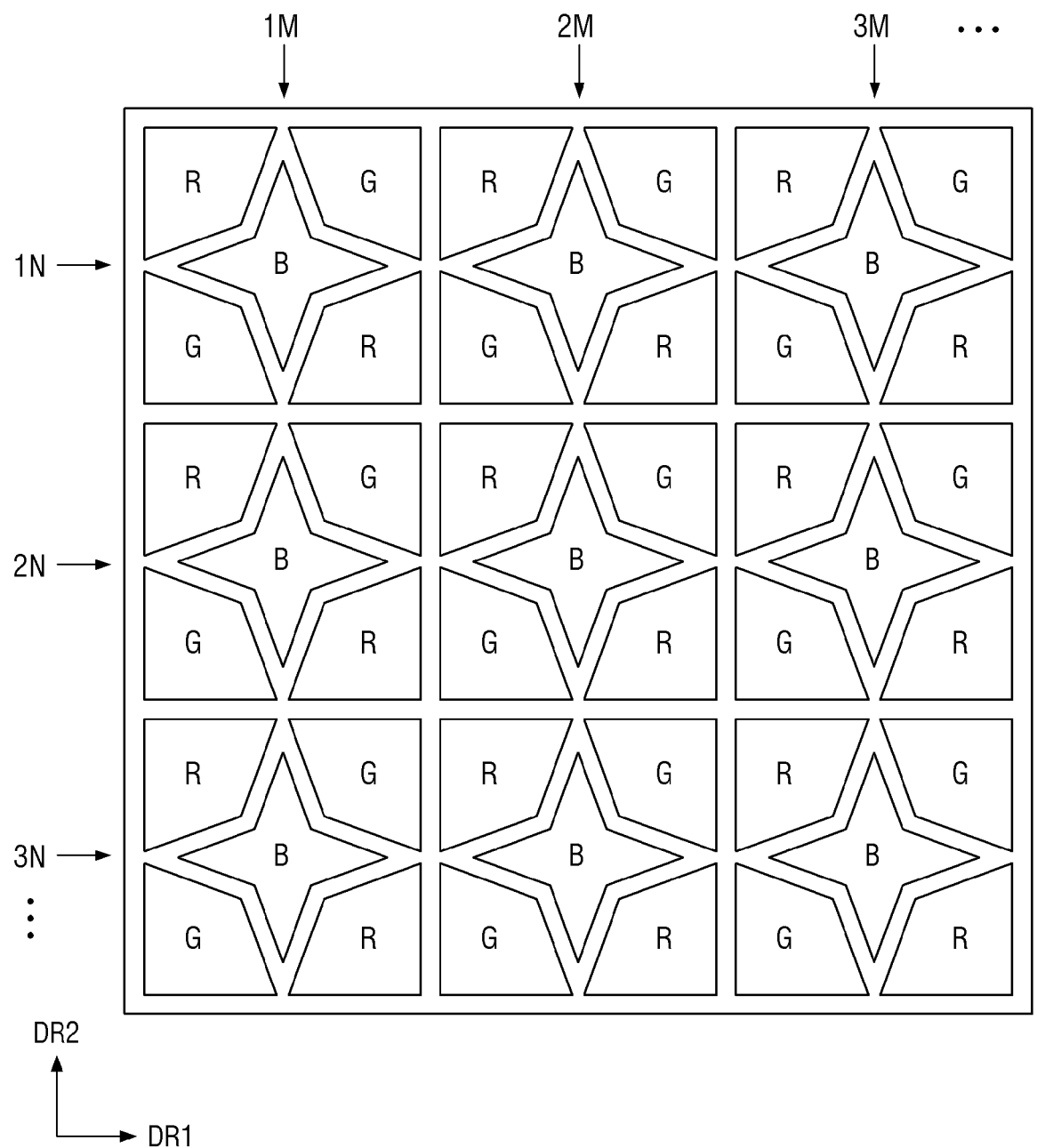
FIG. 10 is a schematic plan view illustrating a plurality of pixels according to an embodiment.

FIG. 6 is a plan view illustrating a pixel according to an embodiment. FIG. 7 is a schematic plan view illustrating a first sub-pixel according to an embodiment. FIG. 8 is a schematic plan view illustrating a third sub-pixel according to an embodiment. FIG. 9 is a schematic plan view illustrating a pixel according to an embodiment. FIG. 10 is a schematic plan view illustrating pixels according to an embodiment.

Referring to FIG. 6, the pixel PX according to an embodiment may include the first sub-pixel SP1, the second sub-pixel SP2, the third sub-pixel SP3, the fourth sub-pixel SP4, and the fifth sub-pixel SP5. The first sub-pixel SP1 may include the first emission area LA1, the second sub-pixel SP2 may include the second emission area LA2, the third sub-pixel SP3 may include the third emission area LA3, the fourth sub-pixel SP4 may include a fourth emission area LA4, and the fifth sub-pixel SP5 may include a fifth emission area LA5. The emission areas LA1, LA2, LA3, LA4, and LA5 may be partitioned by the second pattern BNL2, the first light blocking member BK1, and the second light blocking member BK2 shown in FIG. 3. Each of the second pattern BNL2, the first light blocking member BK1, and the second light blocking member BK2 may have the same planar shape. However, the disclosure is not limited thereto, and the planar shapes of the second pattern BNL2, the first light blocking member BK1, and the second light blocking member BK2 may be different from each other. Starting from FIG. 6, as the illustrated plan views are top views from above, the emission areas LA1, LA2, LA3, LA4, and LA5 may be partitioned by being surrounded by the second light blocking member BK2.

The first sub-pixel SP1 and the fourth sub-pixel SP4 may emit light of the first color, the second sub-pixel SP2 and the fifth sub-pixel SP5 may emit light of the second color, and the third sub-pixel SP3 may emit light of the third color. In an embodiment, the first color may be red, the second color may be green, and the third color may be blue.

The pixel PX according to an embodiment may be formed in a quadrangular shape as a whole and may have, for example, a square shape. In the drawings, the pixel PX having a square shape is illustrated as an example, but the disclosure is not limited thereto. The first emission area LA1, the second emission area LA2, the fourth emission area LA4, and the fifth emission area LA5 may be disposed to surround the third emission area LA3. The third emission area LA3 may be disposed in the center of the pixel PX while being surrounded by the first emission area LA1, the second emission area LA2, the fourth emission area LA4, and the fifth emission area LA5.

The first emission area LA1 and the fourth emission area LA4 which emit light of a same color may be disposed adjacent to each other with the third emission area LA3 interposed therebetween. The second emission area LA2 and the fifth emission area LA5 which emit light of the same color may be disposed adjacent to each other with the third emission area LA3 interposed therebetween. The first emission area LA1 and the second emission area LA2 may be disposed to be spaced apart from each other in the first direction DR1, and the fifth emission area LA5 and the fourth emission area LA4 may be disposed to be spaced apart from each other in the first direction DR1. The first emission area LA1 may be disposed to be spaced apart from the fifth emission area LA5 in the second direction DR2, and the second emission area LA2 may be disposed to be spaced apart from the fourth emission area LA4 in the second direction DR2.

The first emission area LA1, the second emission area LA2, the fourth emission area LA4, and the fifth emission area LA5 may have a quadrangular planar shape. The planar shapes of the first emission area LA1 and the fourth emission area LA4 may be point-symmetric to each other with respect to a central point C1 of the third emission area LA3. The planar shapes of the second emission area LA2 and the fifth emission area LA5 may be point-symmetric to each other with respect to the central point C1 of the third emission area LA3. For example, the emission areas emitting light of the same color may have planar shapes which are point-symmetric to each other with respect to the central point C1 of the third emission area LA3.

The planar shapes of the first emission area LA1 and the second emission area LA2 may be symmetric to each other with respect to an imaginary line IGL1 extending in the second direction DR2 from the central point C1 of the third emission area LA3. The planar shapes of the fourth emission area LA4 and the fifth emission area LA5 may be symmetric to each other with respect to the imaginary line IGL1 extending in the second direction DR2 from the central point C1 of the third emission area LA3. The planar shapes of the first emission area LA1 and the fifth emission area LA5 may be symmetric to each other with respect to an imaginary line IGL2 extending in the first direction DR1 from the central point C1 of the third emission area LA3. The planar shapes of the second emission area LA2 and the fourth emission area LA4 may be symmetric to each other with respect to the imaginary line IGL2 extending in the first direction DR1 from the central point C1 of the third emission area LA3.

The first emission area LA1, the second emission area LA2, the fourth emission area LA4, and the fifth emission area LA5 may be point-symmetric or line-symmetric to each other to have substantially the same shape. In the following, the first emission area LA1 will be described as an example for the planar shapes of the first emission area LA1, the second emission area LA2, the fourth emission area LA4, and the fifth emission area LA5, and the planar shape of the third emission area LA3 will also be described.

Referring to FIG. 7, the first emission area LA1 may have a quadrangular planar shape. Here, the quadrangular planar shape refers to a planar shape partitioned by the second light blocking pattern BK2 surrounding the first emission area LA1. The interior or exterior angles to be described below are angles formed by the side surfaces of the second light blocking pattern BK2 that partitions the emission areas LA1, LA2, LA3, LA4, and LA5. For example, among first interior angles θ11, θ12, and θ13 to be described below, an interior angle of reference numeral θ11 is formed by two line segments that meet each other, and these line segments may be the side surfaces of the second light blocking pattern BK2. Further, in the following, the corners of each of the emission areas LA1, LA2, LA3, LA4, and LA5 are shown as being sharp, but the disclosure is not limited thereto, and the corners may be formed in a round or random shape.

Specifically, the first emission area LA1 may include three first interior angles θ11, θ12, and θ13 equal to or less than about 90 degrees and a second interior angle θ14 greater than about 90 degrees. In an embodiment, one of the first interior angles θ11, θ12, and θ13 may be formed at about 90 degrees and may be opposite to the second interior angle θ14. The remaining first interior angles θ12 and θ13 may be disposed opposite to each other. The first interior angles θ11, θ12, and θ13 may be disposed adjacent to each other in a clockwise direction with respect to the second interior angle θ14.

Referring to FIG. 8, the third emission area LA3 may have an octagonal planar shape as a whole. Specifically, the third emission area LA3 may include four third interior angles θ31, θ32, θ33, and θ34 equal to or less than about 90 degrees and four fourth interior angles θ35, θ36, θ37, and θ38 greater than about 90 degrees. The third interior angles θ31, θ32, θ33, and θ34 and the fourth interior angles θ35, θ36, θ37, and θ38 may be alternately disposed in a clockwise or counterclockwise direction.

Distances from the central point C1 of the third emission area LA3 to vertices AP1, AP2, AP3, and AP4 of the third interior angles θ31, θ32, θ33, and θ34 may be the same. For example, the distance from the central point C1 to the vertex AP1 of the third interior angle θ31 may be equal to the distance from the central point C1 to the vertex AP2 of the third interior angle θ32. Distances from the central point C1 of the third emission area LA3 to vertices AP5, AP6, AP7, and AP8 of the fourth interior angles θ35, θ36, θ37, and θ38 may be the same. For example, the distance from the central point C1 to the vertex AP5 of the fourth interior angle θ35 may be equal to the distance from the central point C1 to the vertex AP6 of the fourth interior angle θ36.

The vertices AP5, AP6, AP7, and AP8 of the fourth interior angles θ35, θ36, θ37, and θ38 may be disposed closer to the central point C1 of the third emission area LA3 than to the vertices AP1, AP2, AP3, and AP4 of the third interior angles θ31, θ32, θ33, and θ34. The distances from the central point C1 of the third emission area LA3 to the vertices AP5, AP6, AP7, and AP8 of the fourth interior angles θ35, θ36, θ37, and θ38 may be shorter than the distances from the central point C1 of the third emission area LA3 to the vertices AP1, AP2, AP3, and AP4 of the third interior angles θ31, θ32, θ33, and θ34. For example, the distance from the central point C1 to the vertex AP5 of the fourth interior angle θ35 may be shorter than the distance from the central point C1 to the vertex AP1 of the third interior angle θ31.

Referring to FIG. 9, the first emission area LA1 may include three interior angles θ11, θ12, and θ13 equal to or less than about 90 degrees and vertices P11, P12, and P13 corresponding to the interior angles, and include an interior angle θ14 greater than about 90 degrees and a vertex P14 corresponding to the interior angle. Similarly, the second emission area LA2 may include three interior angles θ21, θ22, and θ23 equal to or less than about 90 degrees and vertices P21, P22, and P23 corresponding to the interior angles, and include an interior angle θ24 greater than about 90 degrees and a vertex P24 corresponding to the interior angle. The fourth emission area LA4 may include three interior angles θ41, θ42, and θ43 equal to or less than about 90 degrees and vertices P41, P42, and P43 corresponding to the interior angles, and include an interior angle θ44 greater than about 90 degrees, and a vertex P44 corresponding to the interior angle. The fifth emission area LA5 may include three interior angles θ51, θ52, and θ53 equal to or less than about 90 degrees and vertices P51, P52, and P53 corresponding to the interior angles, and include an interior angle θ54 greater than about 90 degrees, and a vertex P54 corresponding to the interior angle.

In each of the first emission area LA1, the second emission area LA2, the fourth emission area LA4, and the fifth emission area LA5, the vertices of the interior angles greater than about 90 degrees may be disposed closer to the central point C1 of the third emission area LA3 than the vertices of the interior angles equal to or less than about 90 degrees. For example, in the first emission area LA1, the vertex P14 of the interior angle θ14 greater than about 90 degrees may be disposed closer to the central point C1 of the third emission area LA3 than the vertices P11, P12, and P13 of the interior angles θ11, θ12, and θ13 equal to or less than about 90 degrees.

In each of the first emission area LA1, the second emission area LA2, the fourth emission area LA4, and the fifth emission area LA5, a vertex of an interior angle greater than about 90 degrees may meet an imaginary line passing through a central point of the corresponding emission area and the central point C1 of the third emission area LA3. In the first emission area LA1 as an example, the vertex P14 of the interior angle θ14 greater than about 90 degrees may meet an imaginary line IGL3 passing through a central point P1 of the first emission area LA1 and the central point C1 of the third emission area LA3.

Each of the vertices AP5, AP6, AP7, and AP8 of the interior angles θ35, θ36, θ37, and θ38 exceeding about 180 degrees in the third emission area LA3 may meet an imaginary line IGL3, IGL4 passing through a central point P1, P2, P4, P5 of each of the first emission area LA1, the second emission area LA2, the fourth emission area LA4, and the fifth emission area LA5, and the central point C1 of the third emission area LA3. For example, the vertex AP5 of the interior angle θ35 exceeding about 180 degrees in the third emission area LA3 may meet the imaginary line IGL4 passing through the central point P2 of the second emission area LA2 and the central point C1 of the third emission area LA3.

In an embodiment, each of the first emission area LA1, the second emission area LA2, the third emission area LA3, the fourth emission area LA4, and the fifth emission area LA5 may occupy a predetermined area according to light conversion efficiency in the pixel PX. The first emission area LA1 and the fourth emission area LA4 may be areas that emit light of the same first color, and light may be converted into the light of the first color by the first wavelength conversion member WLC1 (see FIG. 3) and then emitted.

The second emission area LA2 and the fifth emission area LA5 may be areas that emit light of the same second color, and light may be converted into the light of the second color by the second wavelength conversion member WLC2 (see FIG. 3) and then emitted. The third emission area LA3 may be an area that emits light of the third color, and light may pass through the light transmission member LTU (see FIG. 3) and may be emitted as the light of the third color.

Since the light of the third color in the third emission area LA3 passes through the transparent light transmission member as it is and is emitted, there is no light conversion, so that the amount of light emitted may be close to about 100%. However, since light in the first and fourth emission areas LA1 and LA4 is converted into light of the first color by the first wavelength conversion member WLC1, and light in the second and fifth emission areas LA2 and LA5 is converted into light of the second color by the second wavelength conversion member WLC2, the extraction efficiency of the light emitted according to the light conversion efficiency becomes relatively lower than that of the third emission area LA3. Accordingly, the sum of the areas of the first and fourth emission areas LA1 and LA4, which emit light of the first color, may be larger than the area of the third emission area LA3, and the sum of the areas of the second and fifth emission areas LA2 and LA5, which emit light of the second color, may be larger than the area of the third emission area LA3. In case that the sum of the areas of the first and fourth emission areas LA1 and LA4 emitting light of the first color is larger than the area of the third emission area LA3, and the sum of the areas of the second and fifth emission areas LA2 and LA5 emitting light of the second color is larger than the area of the third emission area LA3, white balance of red, green, and blue light may be improved.

In an embodiment, a ratio of the sum of the areas of the first and fourth emission areas LA1 and LA4 to the area of the third emission area LA3 may be about 2 to about 2.7. A ratio of the sum of the areas of the second and fifth emission areas LA2 and LA5 to the area of the third emission area LA3 may be about 2.4 to about 3.13. In an embodiment, the light conversion efficiency of the first color in the first wavelength conversion member WLC1 per unit area may be about 0.37, the light conversion efficiency of the second color in the second wavelength conversion member WLC2 may be about 0.32, and the light conversion efficiency of the third color in the light transmission member LTU may be about 1 since the light of the third color is transmitted as it is. In this case, with respect to the area 1 of the third emission area LA3, the ratio of the sum of the areas of the first and fourth emission areas LA1 and LA4 may be about 2.70, and the ratio of the sum of the areas of the second and fifth emission areas LA2 and LA5 may be about 3.13.

As described above, in the structure of the pixel PX according to an embodiment, two sub-pixels emitting light of the first color and two sub-pixels emitting light of the second color may be provided in a pixel, thereby increasing a practical resolution. Further, luminance and lifespan may be improved by increasing the areas of the sub-pixels emitting light of the first color and light of the second color to be larger than that of the sub-pixel emitting light of the third color.

Furthermore, the sub-pixels emitting light of the first color and the light of the second color may be formed to have a quadrangular shape with a short circumference in a plan view, and the sub-pixels emitting light of the third color may be formed to have an approximately cross shape in a plan view. Thus, an opening ratio may be increased, and the margin of ink overflow in the inkjet process of a wavelength conversion layer may be improved.

Referring to FIG. 10, in the display device according to an embodiment, the pixels PX described above may be arranged in a matrix. Each of the pixels PX may have the same structure as shown in FIG. 9. The sub-pixels may be disposed to have different emission colors between adjacent pixels PX. For example, the pixels PX arranged in a first row 1N and a first column 1M, and the first row 1N and a second column 2M may emit light of different colors, which are green and red, in the adjacent sub-pixels. Such an arrangement of the pixels PX may be repeated up to a predetermined row and column.

Figure 11:
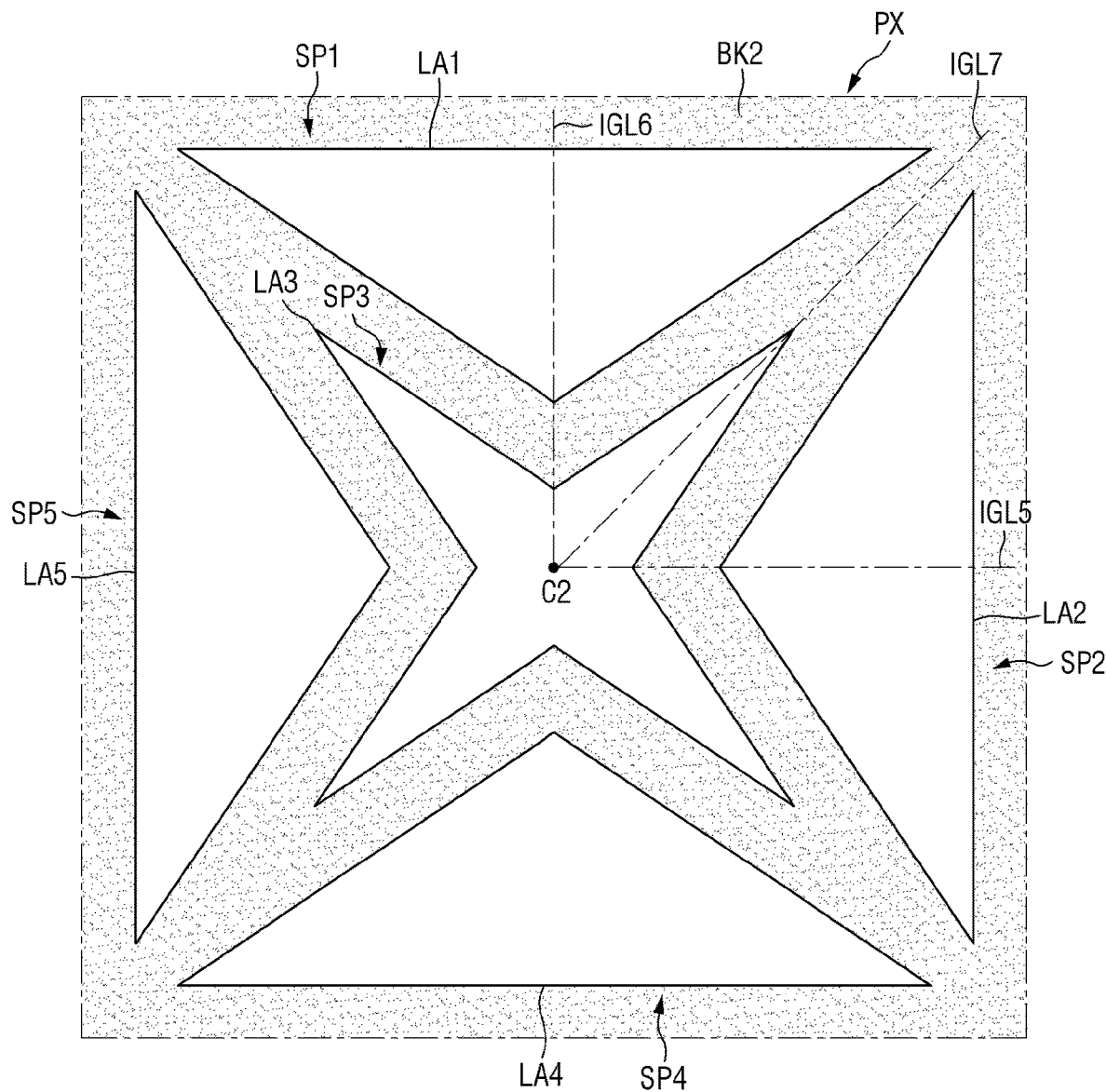
FIG. 11 is a schematic plan view illustrating a pixel according to another embodiment.
Figure 12:
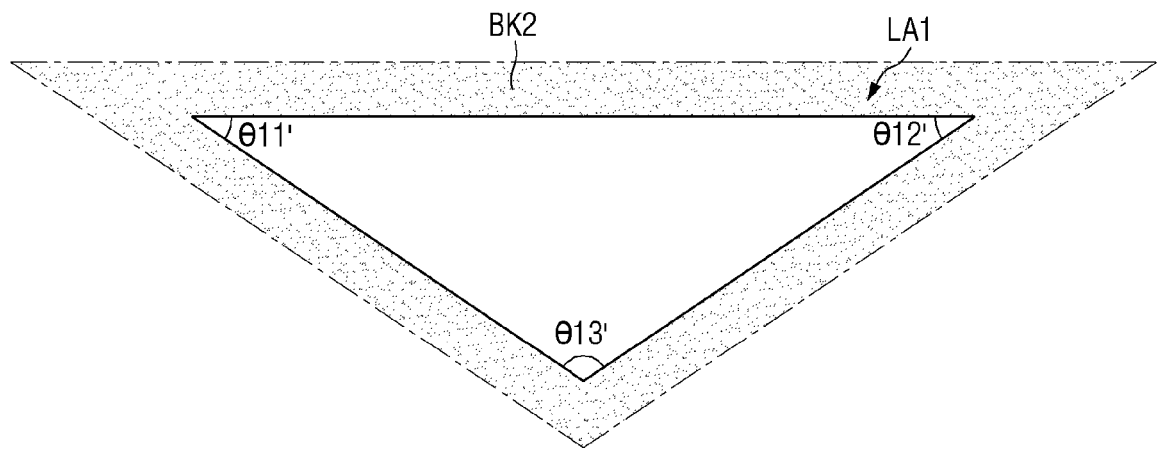
FIG. 12 is a schematic plan view illustrating a first sub-pixel according to an embodiment.
Figure 13:
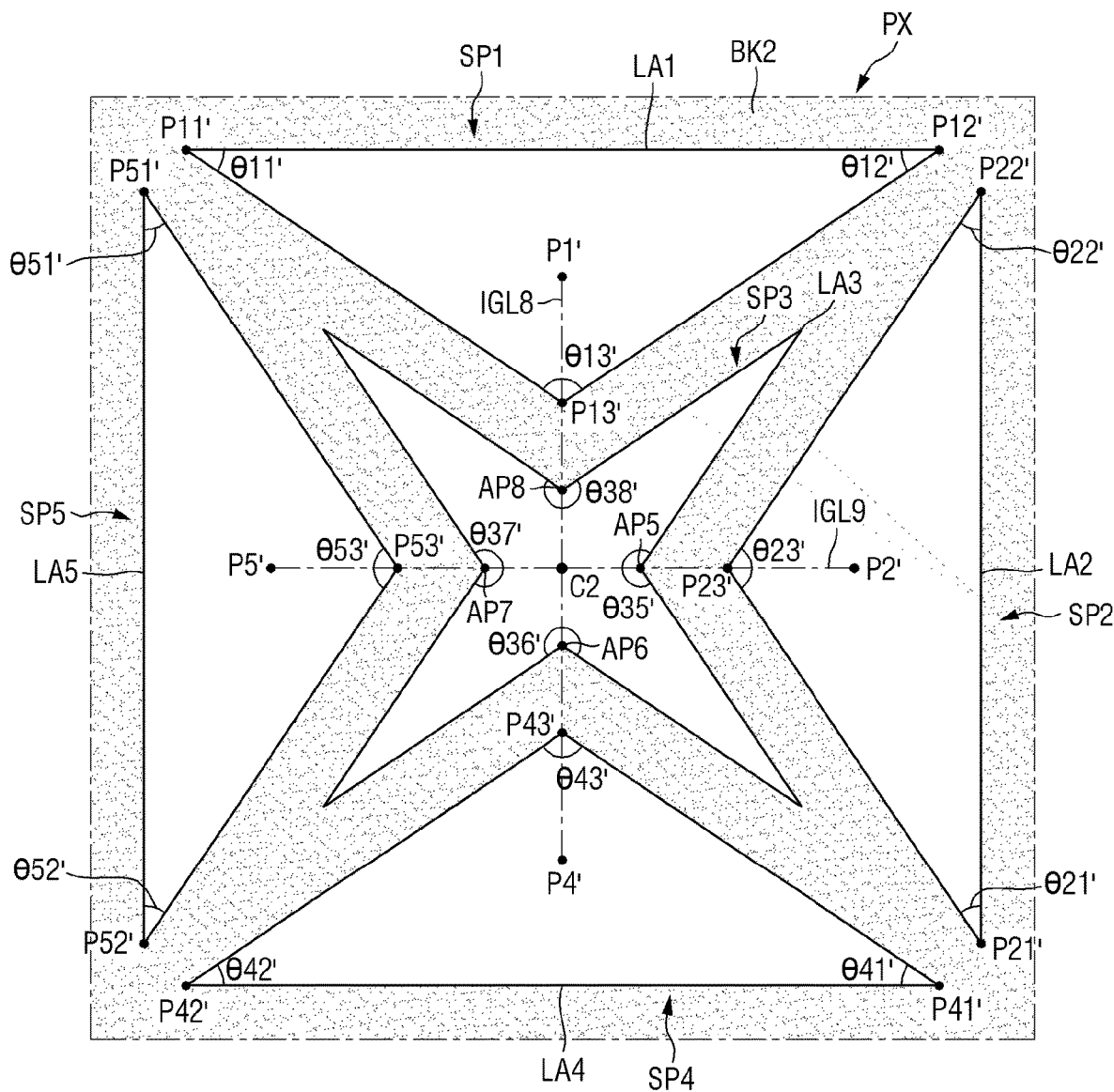
FIG. 13 is a schematic plan view illustrating a pixel according to an embodiment.
Figure 14:
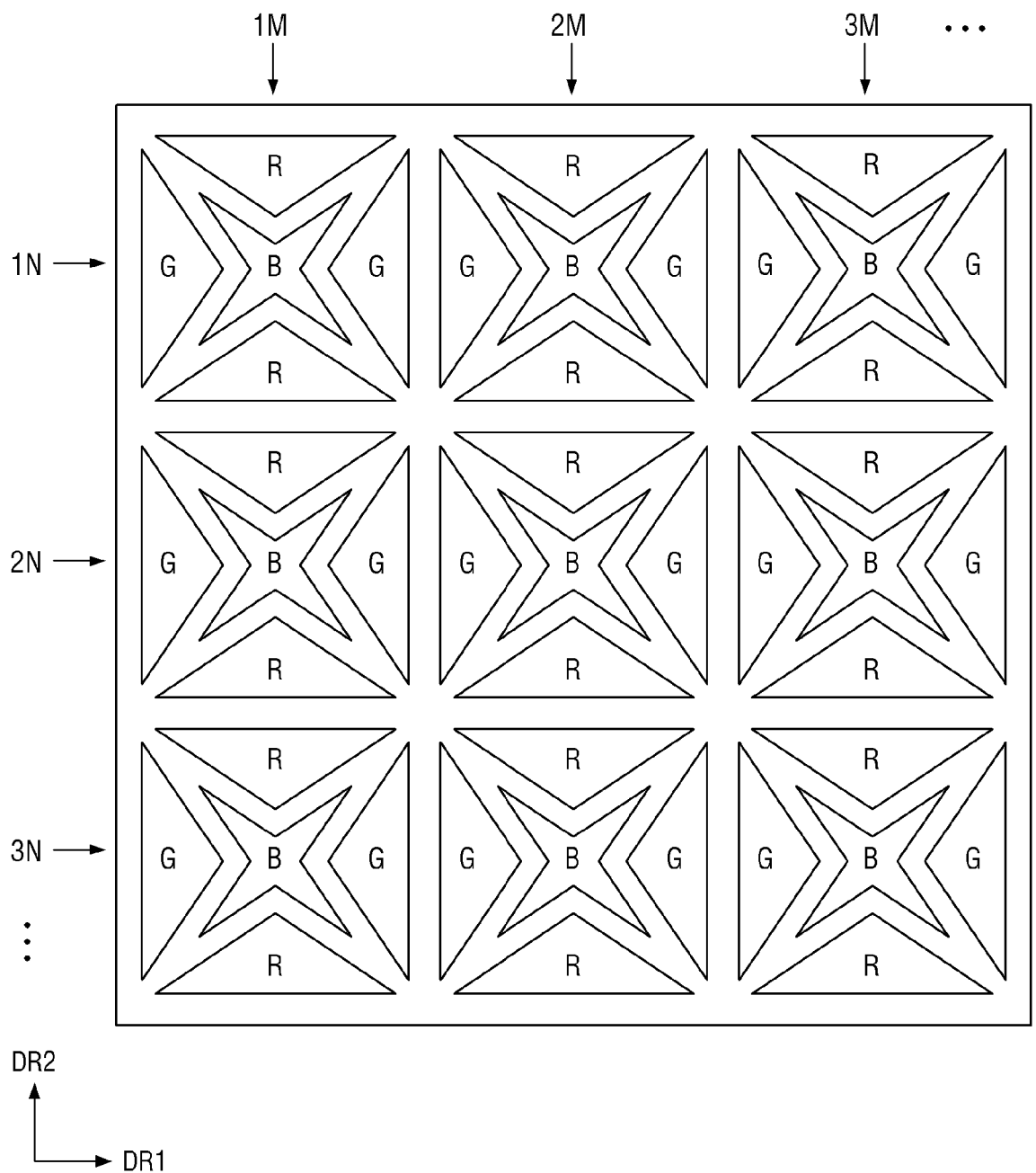
FIG. 14 is a schematic plan view illustrating a plurality of pixels according to an embodiment.

FIG. 11 is a schematic plan view illustrating a pixel according to an embodiment. FIG. 12 is a schematic plan view illustrating a first sub-pixel according to an embodiment. FIG. 13 is a schematic plan view illustrating a pixel according to an embodiment. FIG. 14 is a schematic plan view illustrating pixels according to an embodiment.

Referring to FIG. 11, the pixel PX according to an embodiment may include the first sub-pixel SP1, the second sub-pixel SP2, the third sub-pixel SP3, the fourth sub-pixel SP4, and the fifth sub-pixel SP5. The embodiment differs from the embodiment of FIGS. 6 to 10 at least in that the third sub-pixel SP3 is rotated by about 45 degrees, and accordingly, the shapes of the first sub-pixel SP1, the second sub-pixel SP2, the fourth sub-pixel SP4, and the fifth sub-pixel SP5 are changed. Hereinafter, the same configuration will be briefly described, and the differences will be described in detail.

Referring to FIG. 11, the pixel PX according to an embodiment may include the first sub-pixel SP1, the second sub-pixel SP2, the third sub-pixel SP3, the fourth sub-pixel SP4, and the fifth sub-pixel SP5. The first sub-pixel SP1 may include the first emission area LA1, the second sub-pixel SP2 may include the second emission area LA2, the third sub-pixel SP3 may include the third emission area LA3, the fourth sub-pixel SP4 may include the fourth emission area LA4, and the fifth sub-pixel SP5 may include the fifth emission area LA5. The first sub-pixel SP1 and the fourth sub-pixel SP4 may emit light of the first color, the second sub-pixel SP2 and the fifth sub-pixel SP5 may emit light of the second color, and the third sub-pixel SP3 may emit light of the third color. In an embodiment, the first color may be red, the second color may be green, and the third color may be blue.

The pixel PX according to an embodiment may be formed in a quadrangular shape as a whole and may have, for example, a square shape. In the drawings, the pixel PX having a square shape is illustrated as an example, but the disclosure is not limited thereto. The first emission area LA1, the second emission area LA2, the fourth emission area LA4, and the fifth emission area LA5 may be disposed to surround the third emission area LA3. The third emission area LA3 may be disposed in the center of the pixel PX while being surrounded by the first emission area LA1, the second emission area LA2, the fourth emission area LA4, and the fifth emission area LA5.

The first emission area LA1 and the fourth emission area LA4 that emit light of a same color may be disposed adjacent to each other with the third emission area LA3 interposed therebetween. The second emission area LA2 and the fifth emission area LA5 that emit light of the same color may be disposed adjacent to each other with the third emission area LA3 interposed therebetween. The first emission area LA1 may be disposed to be spaced apart from the third emission area LA3 in the second direction DR2, the second emission area LA2 may disposed to be spaced apart from the third emission area LA3 in the first direction DR1, the fourth emission area LA4 may be disposed to be spaced apart from the third emission area LA3 in a direction opposite to the second direction DR2, and the fifth emission area LA5 may be disposed to be spaced apart from the third emission area LA3 in a direction opposite to the first direction DR1.

The first emission area LA1, the second emission area LA2, the fourth emission area LA4, and the fifth emission area LA5 may have a triangular planar shape. The planar shapes of the first emission area LA1 and the fourth emission area LA4 may be point-symmetric to each other with respect to a central point C2 of the third emission area LA3. The planar shapes of the second emission area LA2 and the fifth emission area LA5 may be point-symmetric to each other with respect to the central point C2 of the third emission area LA3. For example, the emission areas emitting light of the same color may have planar shapes which are point-symmetric to each other with respect to the central point C2 of the third emission area LA3.

The planar shapes of the first emission area LA1 and the second emission area LA2 may be symmetric to each other with respect to an imaginary line IGL7, which passes through the central point C2 of the third emission area LA3 at an angle of about 45 degrees with respect to an imaginary line IGL5 extending in the first direction DR1 from the central point C2 and an imaginary line IGL6 extending in the second direction DR2 from the central point C2. The planar shapes of the fourth emission area LA4 and the fifth emission area LA5 may be symmetric to each other with respect to the imaginary line IGL7 passing through the central point C2 at an angle of about 45 degrees.

The first emission area LA1, the second emission area LA2, the fourth emission area LA4, and the fifth emission area LA5 may be point-symmetric or line-symmetric to each other, and thus may have substantially the same shape. In the following, the first emission area LA1 will be described as an example for the planar shapes of the first emission area LA1, the second emission area LA2, the fourth emission area LA4, and the fifth emission area LA5.

Referring to FIG. 12, the first emission area LA1 may have a triangular planar shape. Specifically, two fifth interior angles $\theta11'$ and $\theta12'$ less than about 90 degrees and a sixth interior angle $\theta13'$ equal to or greater than about 90 degrees may be included. In an embodiment, the first emission area LA1 may be formed in an isosceles triangular shape in which the fifth interior angles $\theta11'$ and $\theta12'$ are the same. The fifth interior angles $\theta11'$ and $\theta12'$ may be disposed adjacent to each other in a clockwise direction with respect to the sixth interior angle $\theta13'$. Since the third emission area LA3 is the same as that in the above-described embodiment of FIG. 8 except that it is rotated about 45 degrees, a description thereof will be omitted.

Referring to FIG. 13, the first emission area LA1 may include two interior angles $\theta11'$ and $\theta12'$ less than about 90 degrees and vertices P11' and P12' corresponding to the interior angles, and include an interior angle $\theta13'$ equal to or greater than about 90 degrees and a vertex P13' corresponding to the interior angle. Similarly, the second emission area LA2 may include two interior angles $\theta21'$ and $022'$ less than about 90 degrees and vertices P21' and P22' corresponding to the interior angles, and include an interior angle $\theta23'$ equal to or greater than 90 degrees and a vertex P23' corresponding to the interior angle. The fourth emission area LA4 may include two interior angles $\theta41'$ and $\theta42'$ less than about 90 degrees and vertices P41' and P42' corresponding to the interior angles, and include an interior angle θ43' equal to or greater than about 90 degrees and a vertex P43' corresponding to the interior angle. The fifth emission area LA5 may include two interior angles θ51' and θ52' less than about 90 degrees and vertices P51' and P52' corresponding to the interior angles, and include an interior angle θ53' equal to or greater than about 90 degrees and a vertex P53' corresponding to the interior angle.

In each of the first emission area LA1, the second emission area LA2, the fourth emission area LA4, and the fifth emission area LA5, the vertices of the interior angles equal to or greater than about 90 degrees may be disposed closer to the central point C2 of the third emission area LA3 than the vertices of the interior angles less than about 90 degrees. For example, in the first emission area LA1, the vertex P13' of the interior angle θ13' equal to or greater than about 90 degrees may be disposed closer to the central point C2 of the third emission area LA3 than the vertices P11' and P12' of the interior angles θ11' and θ12' less than about 90 degrees.

In each of the first emission area LA1, the second emission area LA2, the fourth emission area LA4, and the fifth emission area LA5, the vertex of an interior angle equal to or greater than about 90 degrees may meet an imaginary line passing through a central point C2 of the corresponding emission area and the central point C2 of the third emission area LA3. Taking the first emission area LA1 as an example, the vertex P13' of the interior angle θ13' equal to or greater than about 90 degrees may meet an imaginary line IGL8 passing through a central point P1' of the first emission area LA1 and the central point C2 of the third emission area LA3.

Each of vertices AP5', AP6', AP7', and AP8' of interior angles θ35', θ36', θ37', and θ38' exceeding about 180 degrees in the third emission area LA3 may meet an imaginary line IGL8, IGL9 passing through a central point P1', P2', P4', P5' of each of the first emission area LA1, the second emission area LA2, the fourth emission area LA4, and the fifth emission area LA5, and the central point C2 of the third emission area LA3. For example, the vertex AP5' of the interior angle θ35' exceeding about 180 degrees in the third emission area LA3 may meet the imaginary line IGL9 passing through the central point P2' of the second emission area LA2 and the central point C2 of the third emission area LA3.

In an embodiment, each of the first emission area LA1, the second emission area LA2, the third emission area LA3, the fourth emission area LA4, and the fifth emission area LA5 may occupy a predetermined area according to light conversion efficiency in the pixel PX. The sum of the areas of the first and fourth emission areas LA1 and LA4, which emit light of the first color, may be larger than the area of the third emission area LA3, and the sum of the areas of the second and fifth emission areas LA2 and LA5, which emit light of the second color, may be larger than the area of the third emission area LA3. In case that the sum of the areas of the first and fourth emission areas LA1 and LA4 emitting light of the first color is larger than the area of the third emission area LA3, and the sum of the areas of the second and fifth emission areas LA2 and LA5 emitting light of the second color is larger than the area of the third emission area LA3, white balance of red, green, and blue light may be improved.

In an embodiment, a ratio of the sum of the areas of the first and fourth emission areas LA1 and LA4 to the area of the third emission area LA3 may be about 2 to about 2.7. A ratio of the sum of the areas of the second and fifth emission areas LA2 and LA5 to the area of the third emission area LA3 may be about 2.4 to about 3.13.

As described above, in the structure of the pixel PX according to an embodiment, two sub-pixels emitting light of the first color and two sub-pixels emitting light of the second color may be provided in a pixel, thereby increasing a practical resolution. Further, luminance and lifespan may be improved by increasing the areas of the sub-pixels emitting light of the first color and light of the second color to be larger than that of the sub-pixel emitting light of the third color.

Furthermore, the sub-pixels emitting light of the first color and the light of the second color may be formed to have a triangular shape with a short circumference in a plan view, and the sub-pixels emitting light of the third color may be formed to have an approximately cross shape in a plan view. Thus, an opening ratio may be increased, and the margin of ink overflow in the inkjet process of a wavelength conversion layer may be improved.

Referring to FIG. 14, in the display device according to an embodiment, the pixels PX described above may be arranged in a matrix. Each of the pixels PX may have the same structure as shown in FIG. 13. The sub-pixels may be disposed to have the same emission color between adjacent pixels PX. For example, the pixels PX arranged in the first row 1N and the first column 1M, and the first row 1N and the second column 2M may emit light of the same color, which is green, in the adjacent sub-pixels. Such an arrangement of the pixels PX may be repeated up to a predetermined row and column.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:
1. A display device comprising:
pixels including:
    a first sub-pixel including a first emission area;
    a second sub-pixel including a second emission area;
    a third sub-pixel including a third emission area;
    a fourth sub-pixel including a fourth emission area; and
    a fifth sub-pixel including a fifth emission area,
        wherein
    the first sub-pixel and the fourth sub-pixel emit light of a first color,
    the second sub-pixel and the fifth sub-pixel emit light of a second color,
    the third sub-pixel emits light of a third color,
    the first emission area of the first sub-pixel, the second emission area of the second sub-pixel, the fourth emission area of the fourth sub-pixel, and the fifth emission area of the fifth sub-pixel each have a quadrangular shape and surround the third emission area of the third sub-pixel,
    the third emission area of the third sub-pixel has four interior angles greater than about 180 degrees, and another four interior angles less than about 90 degrees, and
    each of edges of the first, second, fourth and fifth emission areas facing toward the third emission area is parallel to an adjacent one of edges of the third emission area and each of edges of the first, second, fourth and fifth emission areas is not parallel to an adjacent one of the edges of the first, second, fourth and fifth emission areas.

2. The display device of claim 1, wherein
the first color is red,
the second color is green, and
the third color is blue.

3. The display device of claim 2, wherein
the first emission area and the fifth emission area are disposed adjacent to each other with the third emission area disposed between the first emission area and the third emission area, and
the second emission area and the fourth emission area are adjacent to each other with the third emission area disposed between the second emission area and the fourth emission area.

4. The display device of claim 3, wherein each of the first emission area, the second emission area, the fourth emission area, and the fifth emission area has a quadrangular shape having three interior angles equal to or less than about 90 degrees and one interior angle greater than about 90 degrees.

5. The display device of claim 4, wherein in each of the first emission area, the second emission area, the fourth emission area, and the fifth emission area, a vertex of the one interior angle greater than about 90 degrees is disposed closer to a central point of the third emission area than each of vertices of the three interior angles equal to or less than about 90 degrees.

6. The display device of claim 4, wherein in each of the first emission area, the second emission area, the fourth emission area, and the fifth emission area, a vertex of the one interior angle greater than about 90 degrees is aligned on a straight imaginary line passing through a central point of the emission area corresponding to the vertex and a central point of the third emission area.

7. The display device of claim 6, wherein
two vertices facing each other among vertices of the four interior angles greater than about 180 degrees, which are included in the third emission area, are aligned on the straight imaginary line passing through the central points of the first and fourth emission areas or the straight imaginary line passing through the central points of the second and fifth emission areas.

8. The display device of claim 1, wherein the four interior angles greater than about 180 degrees and the another four interior angles less than about 90 degrees, which are included in the third emission area, are alternately arranged in a clockwise direction.

9. The display device of claim 8, wherein vertices of the four interior angles greater than about 180 degrees, which are included in the third emission area, are disposed closer to a central point of the third emission area than vertices of the another four interior angles less than about 90 degrees, which are included in the third emission area.

10. The display device of claim 1, wherein
a sum of an area of the first emission area and an area of the fourth emission area is larger than an area of the third emission area, and
a sum of areas of the second emission area and the fifth emission area is larger than the area of the third emission area.

11. The display device of claim 10, wherein a ratio of the sum of the areas of the first emission area and the fourth emission area to the area of the third emission area is in a range of about 2 to about 2.7.

12. The display device of claim 10, wherein a ratio of the sum of the areas of the second emission area and the fifth emission area to the area of the third emission area is in a range of about 2.4 to about 3.13.

13. A display device comprising:
pixels including:
a first sub-pixel including a first emission area;
a second sub-pixel including a second emission area;
a third sub-pixel including a third emission area;
a fourth sub-pixel including a fourth emission area; and
a fifth sub-pixel including a fifth emission area;
wherein
the first sub-pixel and the fourth sub-pixel emit light of a first color,
the second sub-pixel and the fifth sub-pixel emit light of a second color,
the third sub-pixel emits light of a third color,
the first emission area of the first sub-pixel, the second emission area of the second sub-pixel, the fourth emission area of the fourth sub-pixel, and the fifth emission area of the fifth sub-pixel have a triangular shape and surround the third emission area of the third sub-pixel,
the third emission area of the third sub-pixel has four interior angles greater than about 180 degrees and another four interior angles less than about 90 degrees, and
two edges of each of the first, second, fourth, and fifth emission areas are parallel to adjacent ones of edges of the third emission area, respectively.

14. The display device of claim 13, wherein each of the first emission area, the second emission area, the fourth emission area, and the fifth emission area has a triangular shape having one interior angle equal to or greater than about 90 degrees and two interior angles less than about 90 degrees.

15. The display device of claim 14, wherein in each of the first emission area, the second emission area, the fourth emission area, and the fifth emission area, a vertex of the one interior angle equal to or greater than about 90 degrees is disposed closer to a central point of the third emission area than each of vertices of the two interior angles less than about 90 degrees.

16. The display device of claim 13, wherein a ratio of a sum of an area of the first emission area and an area of the fourth emission area to an area of the third emission area is in a range of about 2 to about 2.7.

17. The display device of claim 13, wherein a ratio of a sum of an area of the second emission area and an area of the fifth emission area to an area of the third emission area is in a range of about 2.4 to about 3.13.

18. The display device of claim 13, wherein
each of the first sub-pixel, the second sub-pixel, the third sub-pixel, the fourth sub-pixel, and the fifth sub-pixel includes a light emitting element layer, and
the light emitting element layer includes:
a first electrode and a second electrode extending in a direction and arranged parallel to each other and disposed on a substrate;
a light emitting element having a first end and a second end disposed on the first electrode and the second electrode, respectively;
a first connection electrode electrically connected to the first end of the light emitting element; and
a second connection electrode connected to the second end of the light emitting element.

19. The display device of claim 18, wherein the light emitting element includes:
a first semiconductor layer;
a second semiconductor layer disposed on the first semiconductor layer;

a light emitting layer disposed between the first semiconductor layer and the second semiconductor layer; and an insulating layer overlapping the first semiconductor layer, the second semiconductor layer, and the light emitting layer.

20. The display device of claim 18, wherein each of the first sub-pixel, the second sub-pixel, the third sub-pixel, the fourth sub-pixel, and the fifth sub-pixel includes a wavelength conversion layer disposed on the light emitting element layer, and the wavelength conversion layer includes:
- a first wavelength conversion member disposed in the first sub-pixel and the fourth sub-pixel and converting light of the third color into light of the first color;
- a second wavelength conversion member disposed in the second sub-pixel and the fifth sub-pixel and converting light of the third color into light of the second color; and
- a light transmission member disposed in the third sub-pixel and transmitting light of the third color.

* * * * *